US011538534B1

(12) United States Patent
Zamir et al.

(10) Patent No.: US 11,538,534 B1
(45) Date of Patent: Dec. 27, 2022

(54) SOFT BIT REFERENCE LEVEL CALIBRATION USING DECODED DATA

(71) Applicant: Western Digital Technologies, Inc., San Jose, CA (US)

(72) Inventors: Ran Zamir, Ramat Gan (IL); Alexander Bazarsky, Holon (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 72 days.

(21) Appl. No.: 17/342,183

(22) Filed: Jun. 8, 2021

(51) Int. Cl.
| | | |
|---|---|---|
| G06F 12/00 | (2006.01) | |
| G11C 16/26 | (2006.01) | |
| G06F 11/10 | (2006.01) | |
| G11C 29/52 | (2006.01) | |
| G06F 3/06 | (2006.01) | |
| G11C 16/34 | (2006.01) | |

(Continued)

(52) U.S. Cl.
CPC ............ *G11C 16/26* (2013.01); *G06F 3/0619* (2013.01); *G06F 3/0632* (2013.01); *G06F 3/0659* (2013.01); *G06F 3/0679* (2013.01); *G06F 11/1068* (2013.01); *G11C 11/56* (2013.01); *G11C 16/3459* (2013.01); *G11C 29/52* (2013.01); *G11C 16/0483* (2013.01); *H01L 25/0657* (2013.01); *H01L 2225/06562* (2013.01)

(58) Field of Classification Search
CPC ..... G11C 16/26; G11C 11/56; G11C 16/3459; G11C 29/52; G11C 16/0483; G06F 3/0619; G06F 3/0632; G06F 3/0659; G06F 3/0679; G06F 11/1068; H01L 25/0657; H01L 2225/06562

USPC ......................................................... 711/103
See application file for complete search history.

(56) References Cited

U.S. PATENT DOCUMENTS

| | | | |
|---|---|---|---|
| 8,009,472 B2 | 8/2011 | Murin et al. | |
| 8,099,652 B1 * | 1/2012 | Alrod ..................... | G11C 16/26 |
| | | | 714/763 |

(Continued)

FOREIGN PATENT DOCUMENTS

| | | | | |
|---|---|---|---|---|
| CN | 104934062 A | * | 9/2015 | ......... G11C 11/5628 |

OTHER PUBLICATIONS

Peleato, Borja, et al., "Adaptive Read Thresholds for NAND Flash," IEEE Transactions on Communications, vol. 63, Issue 9, Sep. 2015, 12 pages.

*Primary Examiner* — Mardochee Chery
(74) *Attorney, Agent, or Firm* — Vierra Magen Marcus LLP

(57) ABSTRACT

Calibration of soft bit reference levels in a non-volatile memory system is disclosed. When the soft bit reference levels are to be calibrated, encoded data is read from a group of the memory cells. The encoded data is decoded and error corrected. Therefore, the original data that was programmed into the memory cells is recovered. The group of memory cells are sensed at candidate soft bit reference levels, and possibly other reference levels. For each candidate soft bit reference level, mutual information between the original programmed data and the data for that candidate soft bit reference level is determined. The mutual information serves as a good measure for how well the candidate soft bit reference level will aid in decoding the data. In an aspect, a soft bit reference level having the highest mutual information out of several candidates is selected as the calibrated soft bit reference level.

20 Claims, 25 Drawing Sheets

(51) Int. Cl.
*G11C 11/56* (2006.01)
*G11C 16/04* (2006.01)
*H01L 25/065* (2006.01)

(56) References Cited

U.S. PATENT DOCUMENTS

| | | | |
|---|---|---|---|
| 8,125,833 B2 | 2/2012 | Sharon et al. | |
| 8,718,585 B2* | 5/2014 | Clevorn | H04W 52/26 455/161.3 |
| 10,025,661 B1* | 7/2018 | Shukla | G11C 11/5621 |
| 10,566,061 B2 | 2/2020 | Karakulak et al. | |
| 2014/0359202 A1 | 12/2014 | Sun et al. | |
| 2014/0362646 A1 | 12/2014 | Sharon et al. | |
| 2017/0148510 A1 | 5/2017 | Bazarsky et al. | |
| 2022/0051746 A1* | 2/2022 | Zamir | G11C 29/46 |

\* cited by examiner

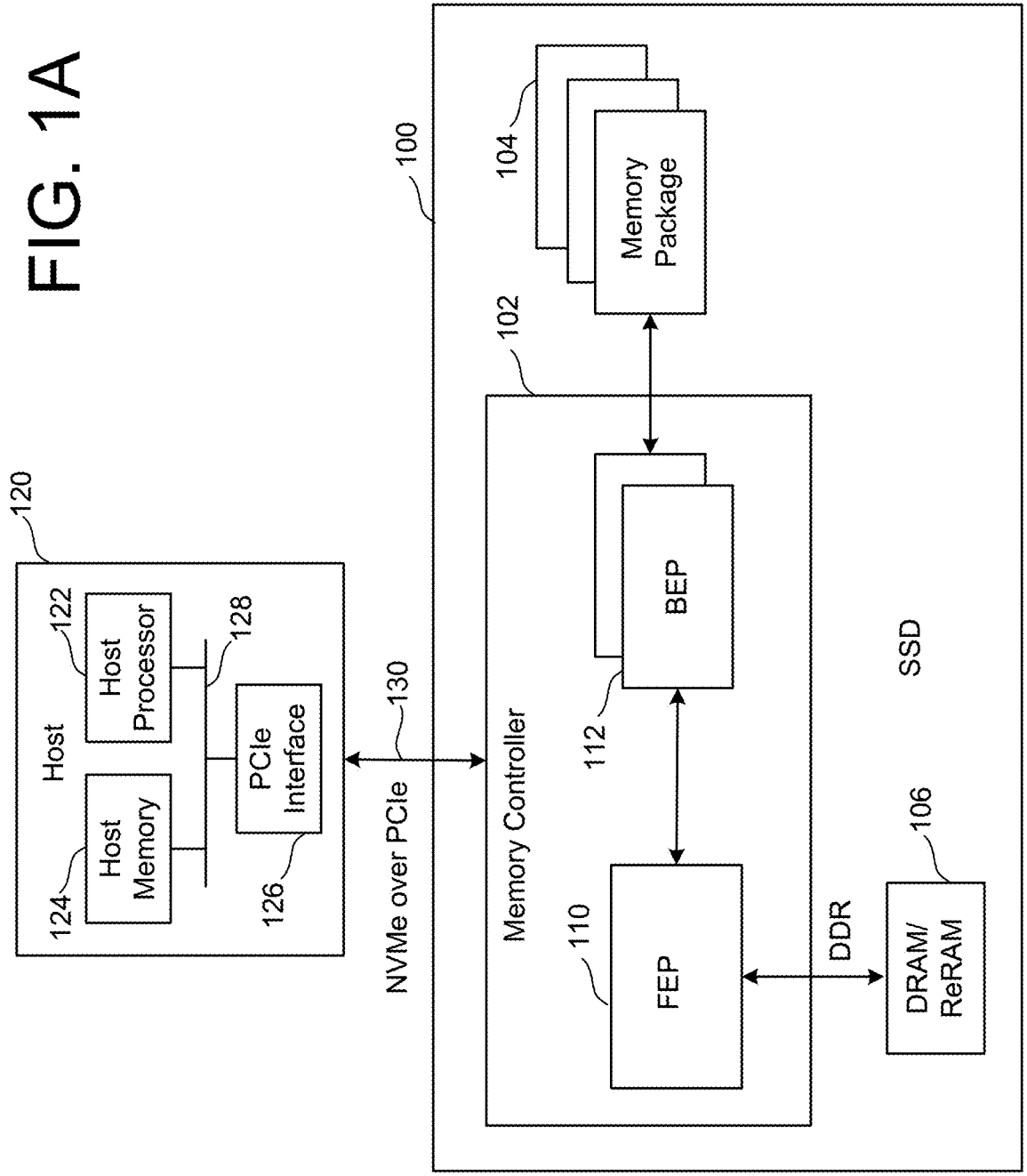

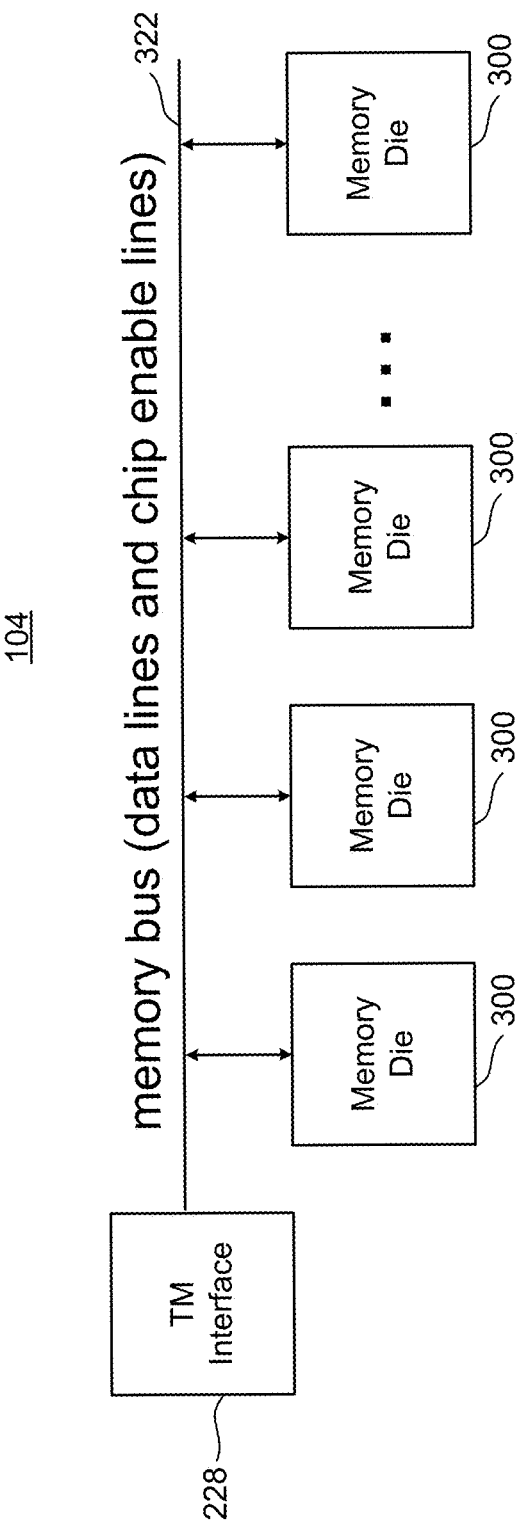

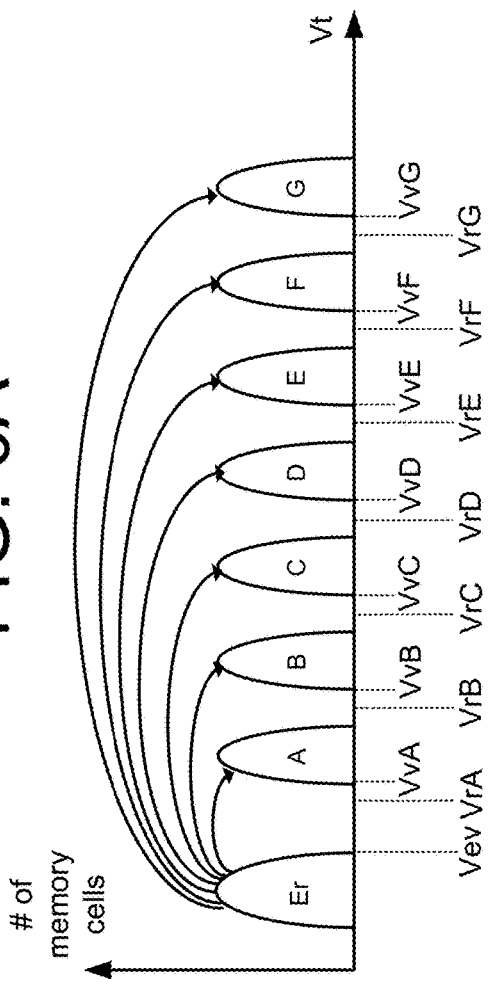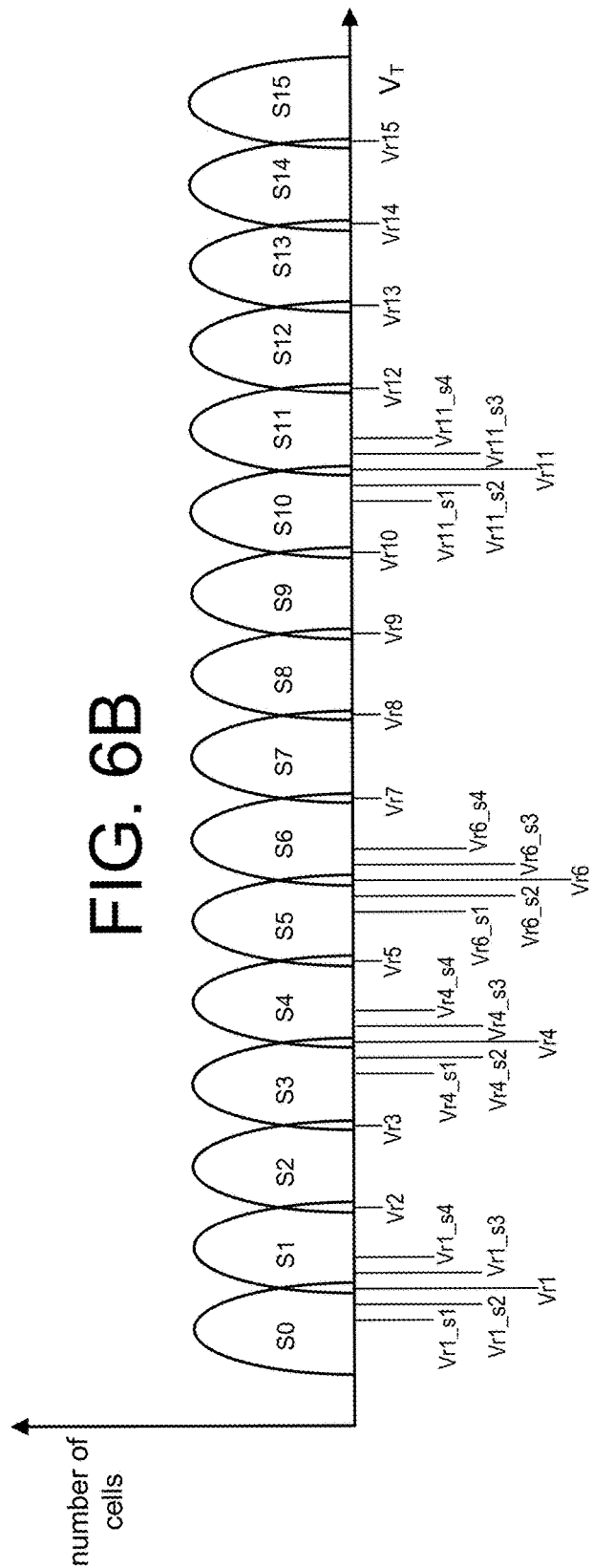

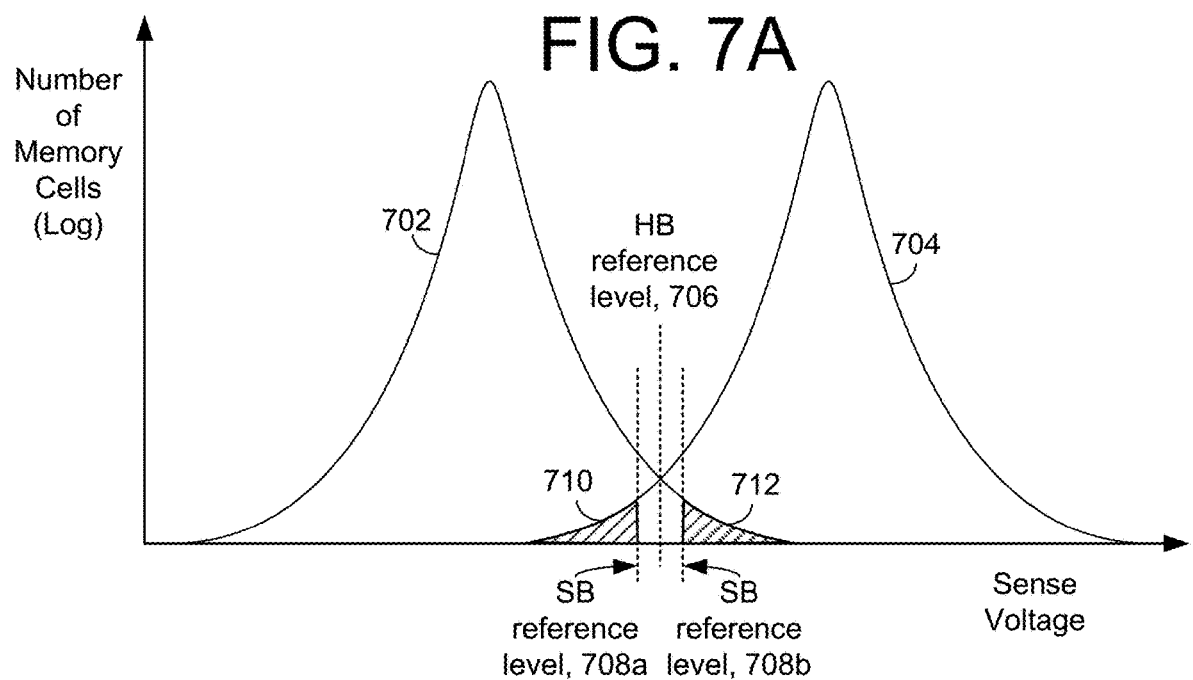
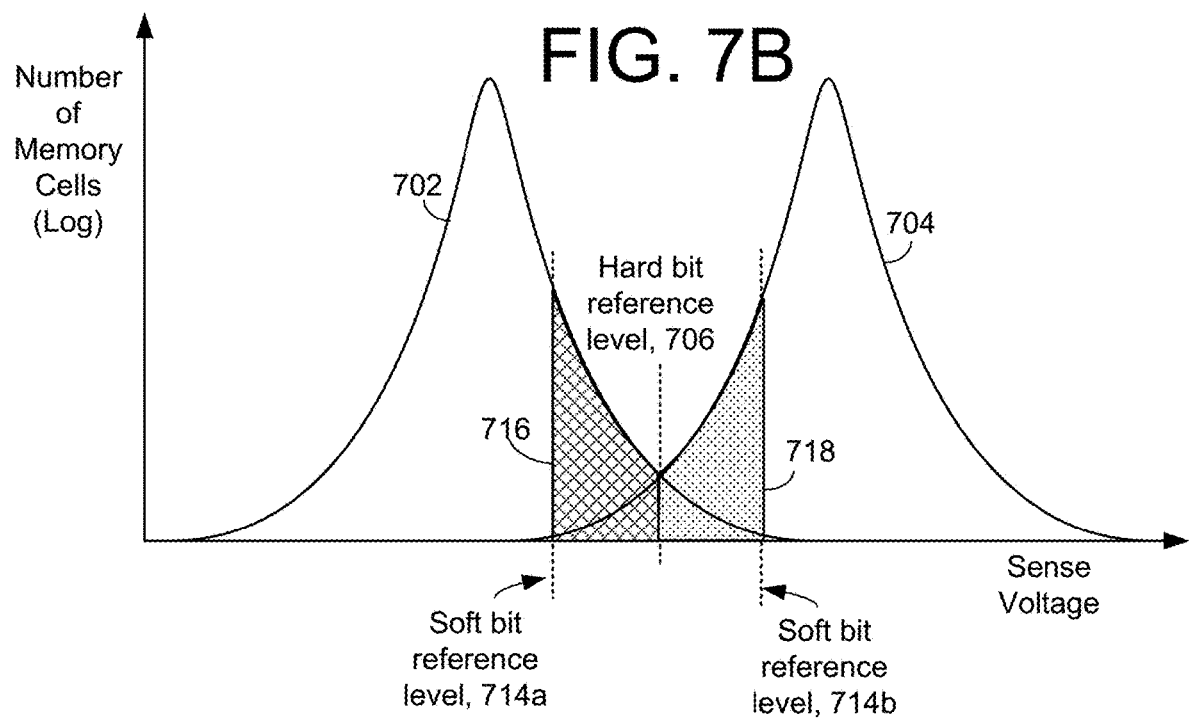

SOFT BIT REFERENCE LEVEL CALIBRATION USING DECODED DATA

BACKGROUND

The strong growth in demand for portable consumer electronic devices is driving the need for high-capacity storage devices. Non-volatile semiconductor memory devices (also referred to herein as "non-volatile memory systems"), such as flash memory storage cards, are widely used to meet the ever-growing demands on digital information storage and exchange. Their portability, versatility and rugged design, along with their high reliability and large capacity, have made such memory devices ideal for use in a wide variety of host electronic devices, including for example digital cameras, digital music players, video game consoles, PDAs, cellular telephones, desktop computers, laptop computers, and notepad computers. Typically, the host electronic devices provides power to the non-volatile memory system.

Storing multiple bits of information in a single non-volatile memory cell typically includes mapping sequences of bits to states of the non-volatile memory cell. For example, a first sequence of bits "110" may correspond to a first state of a non-volatile memory cell and a second sequence of bits "010" may correspond to a second state of the non-volatile memory cell. After determining that a sequence of bits is to be stored into a particular non-volatile memory cell, the non-volatile memory cell may be programmed to a state that corresponds to the sequence of bits.

Once the memory cells in the memory device have been programmed, data may be read from the memory cells by sensing the programming states of the memory cells. In one technique, the memory cells are sensed at one or more "hard bit reference voltages." A hard bit reference voltage is used to distinguish between two of the states. However, sensed states can sometimes vary from the written programmed states due to one or more factors. Error detection and correction decoding can be used to detect and correct data errors resulting from sensed states that do not match written programmed states. Some error correction decoding makes use of only "hard bits," which are derived from sensing at the hard bit reference voltages.

Improved error correction capability may be achieved by decoding data using soft bits. Soft bits are derived from sensing the memory cells at a set of "soft bit reference voltages." Soft bits can indicate the reliability of a hard bit for each memory cell. To illustrate, soft bits may be used with ECC (Error Correcting Codes) decoding to enhance error correction capability in non-volatile memory systems that may experience memory cell errors and internal transmission errors. For example, improved error correction capability may be achieved by using low-density parity-check (LDPC) codes, and including soft bit values, as inputs to a decoder as compared to a decoding scheme that is based on using hard bits only.

In some techniques, there are one or more soft bit reference voltages on each side of each hard bit reference voltage. For example, there may be a soft bit reference voltage at a voltage slightly lower than a hard bit reference voltage, as well as a soft bit reference voltage at a voltage slightly higher than the hard bit reference voltage. In some cases, there are two soft bit reference voltages on each side of the hard bit reference voltage. In some cases, there are three soft bit reference voltages on each side of the hard bit reference voltage.

However, the error correction capability depends on the quality of the soft reliability information. Using soft bits that were not sensed in the correct location (e.g., correct voltage level) can degrade the quality of the soft reliability information and make it less informative. Setting the location of the soft bit thresholds is a trade-off. If the soft bit reference voltages are too close to the hard bit reference voltage, then many of the errors are not marked as low reliability. On the other hand, if the soft bit reference voltages are too far from the hard bit reference voltage, then too many correct bits are marked as unreliable.

DESCRIPTION OF THE DRAWINGS

Like-numbered elements refer to common components in the different Figures.

FIG. 1A is a block diagram of one embodiment of a memory system connected to a host.

FIG. 2B is a block diagram of one embodiment of a memory package.

FIG. 6A illustrates example threshold voltage distributions for the memory array when each memory cell stores three bits of data.

FIG. 6B depicts threshold voltage distributions in which each memory cell stores four bits of data.

FIG. 7A depicts an example in which the soft bit thresholds might be set too close to the hard bit threshold.

FIG. 7B depicts an example in which the soft bit thresholds might be set too far from the hard bit threshold.

DETAILED DESCRIPTION

Figure 1B:
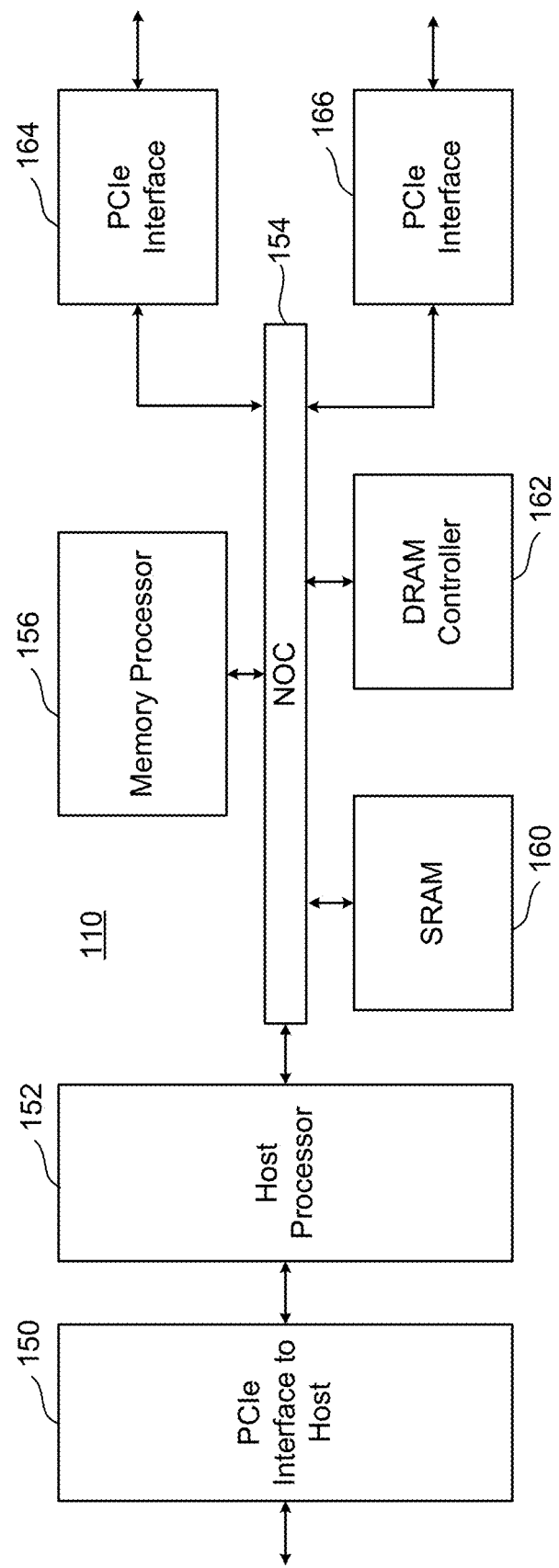
FIG. 1B is a block diagram of one embodiment of a Front End Processor Circuit.

The present technology will now be described with reference to the figures, which in embodiments, relate to calibration of soft bit reference levels in a non-volatile memory system. Calibrating soft bit reference levels means to calibrate the separation between a hard bit reference level and the associated soft bit reference levels. The separation between a hard bit reference level and a soft bit reference level may be referred to herein as a "soft bit delta." Herein, many examples will be provided in which the hard bit and soft bit reference levels are reference voltage levels, but the reference levels could be other physical parameters such as current levels. Calibrating the soft bit reference levels improves the quality of the reliability information (e.g., soft bits) derived from sensing non-volatile memory cells at the soft bit reference levels. Therefore, error correction based on the soft bits is improved.

In an embodiment, the soft bit reference levels (or soft bit deltas) are calibrated based on data that was programmed into the non-volatile memory cells. When the soft bit reference levels are calibrated, encoded data is read from a group of the memory cells. This encoded data is decoded and error corrected. Therefore, the original data that was programmed into the memory cells is recovered. The group of memory cells are sensed at candidate soft bit reference levels, and possibly other levels, which generates several sets of data. The candidate soft bit reference levels are on one side of, and close to, an associated hard bit reference level. Note that sensing can also occur at other reference levels such as the hard bit reference level, and other soft bit reference levels in order to generate the data. The result includes data for each candidate soft bit reference level. For each candidate soft bit reference level, mutual information between the original programmed data and the data for that candidate soft bit reference level is determined. The term mutual information is used herein as is common in probability and information theory in which the mutual information of two variables is a measure of the mutual dependance between the two variables. The mutual information serves as a good measure for how well soft information from reading at the candidate soft bit reference level will aid in decoding the data. In an embodiment, a soft bit reference level having the highest mutual information out of several candidates is selected as a new soft bit reference level for one side of a hard bit reference level. In a similar manner, a new soft bit reference level for the other side of the hard bit reference level may be determined. Also, new soft bit reference levels for other hard bit reference levels may be determined. Hence, calibrating the soft bit reference levels based on the error corrected data improves the quality of the reliability information (e.g., soft bits). These new soft bit reference levels can be used when reading the group of memory cells that were tested, as well as other memory cells.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

FIG. 1A-4B describe one example of a memory system that can be used to implement embodiments of soft bit reference level calibration disclosed herein. FIG. 1A is a block diagram of one embodiment of a memory system 100 connected to a host system 120. Memory system 100 can implement the technology disclosed herein. Many different types of memory systems can be used with the technology disclosed herein. One example memory system is a solid state drive ("SSD"); however, other types of memory systems can also be used. Memory system 100 comprises a memory controller 102, memory package 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit110. In some embodiments, an integrated memory assembly is referred to as a memory package. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 may perform a portion of embodiments of soft bit reference calibration based on decoded data stored in memory cells in a memory package 104. In some embodiments, memory controller decodes the data to correct any errors in the encoded data read from the memory cells, to thereby recover the original data that was programmed into the memory cells.

In one embodiment, there are a plurality of memory packages 104. Each memory package 104 may contain one or more memory dies. In one embodiment, each memory die in the memory package 104 utilize NAND flash memory (including two dimensional NAND flash memory and/or three dimensional NAND flash memory). In other embodiments, the memory package 104 can include other types of memory; for example, the memory package can include Phase Change Memory (PCM) memory.

In an embodiment, memory controller 102 communicates with host system 120 using an interface 130 that implements NVM Express (NVMe) over PCI Express (PCIe). For working with memory system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from memory system 100. In one embodiment, memory system 100 is embedded in host system 120.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 2A:
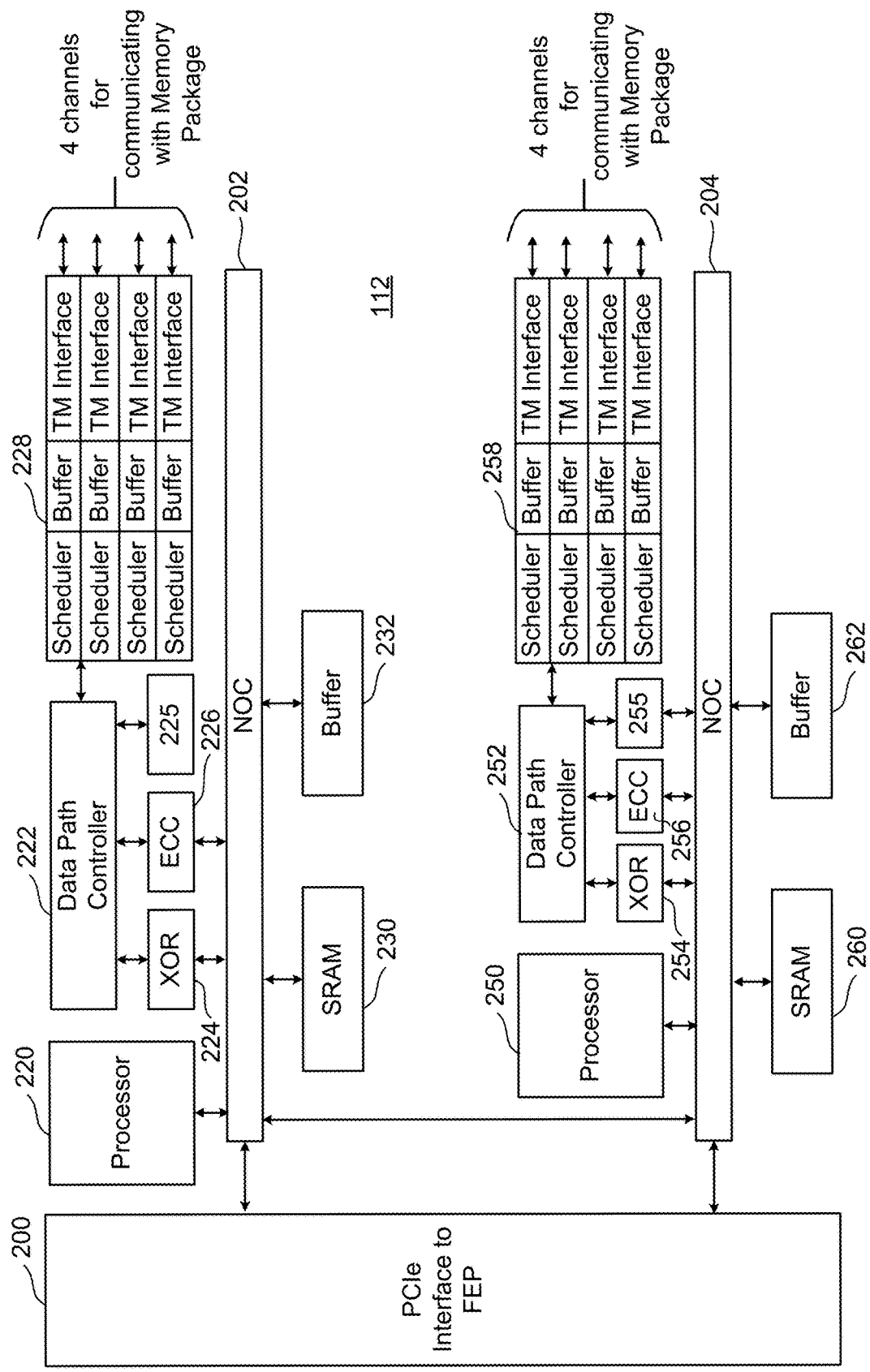
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256), and a read reference voltage calibration engine (225/255). In one embodiment, the read reference voltage calibration engine (225/255) is configured to calibrate soft bit reference voltages. The read reference voltage calibration engine may also calibrate hard bit reference voltages. It is not required that reference voltages, such as soft bit reference voltages, be calibrated in the memory controller 102. In some embodiments, the soft bit reference voltages are calibrated within the memory packages 104.

The ECC engines 226/256 are used to perform error correction, as known in the art. Herein, the ECC engines 226/256 may be referred to as controller ECC engines. In some embodiments, the ECC engines 226/256 are used to decode encoded data that is read from memory cells in the memory packages 104 during soft bit reference voltage calibration. The ECC engines 226/256 correct any errors in the encoded data to thereby recover the original data that was programmed into the memory cells. In some embodiments, the memory controller 102 sends this recovered data to a memory package 104, which uses the recovered data when calibrating soft bit reference levels.

The XOR engines 224/254 are used to XOR the data so that data can be combined and stored in a manner that can be recovered in case there is a programming error. Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254, ECC engines 226/256, and read reference voltage calibration engines (225/255) are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

FIG. 2B is a block diagram of one embodiment of a memory package 104 that includes a plurality of memory die 300 connected to a memory bus (data lines and chip enable lines) 322. The memory bus 322 connects to a Toggle Mode Interface 228 for communicating with the TM Interface of a BEP circuit 112 (see e.g., FIG. 2A). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 3A:
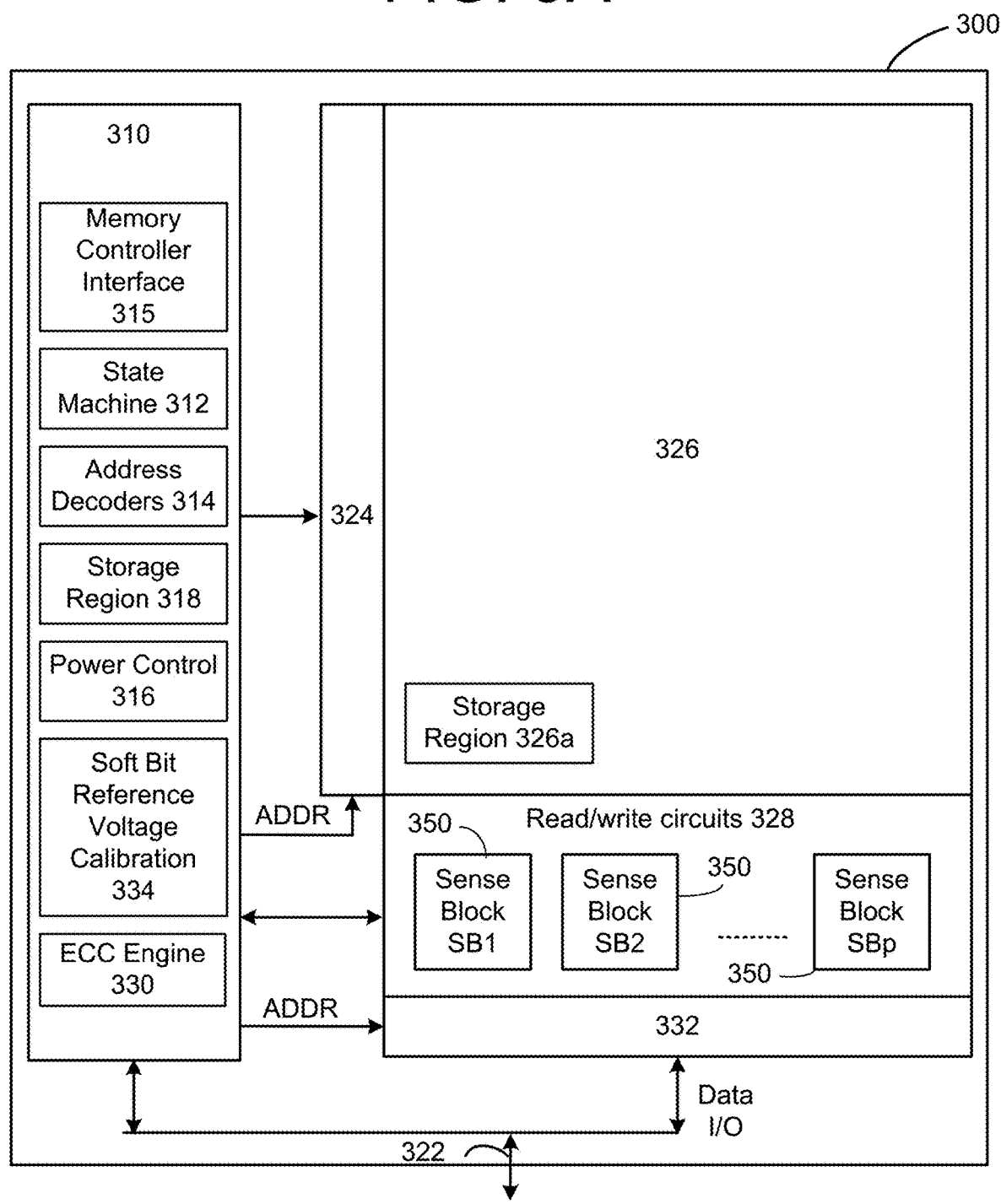
FIG. 3A is a functional block diagram of an embodiment of a memory die.

FIG. 3A is a functional block diagram of one embodiment of a memory die 300. Each of the one or more memory die 300 of FIG. 2B can be implemented as memory die 300 of FIG. 3A. The components depicted in FIG. 3A are electrical circuits. In one embodiment, each memory die 300 includes a memory structure 326, control circuitry 310, read/write circuits 328, and decoders 324/332, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the memory controller 102 and the memory die 300 via memory controller interface 315. Memory controller interface 315 is an electrical interface for communicating with memory controller 102. Examples of memory controller interface 315 include a Toggle Mode Interface and an Open NAND Flash Interface (ONFI). Other I/O interfaces can also be used. For example, memory controller interface 315 may implement a Toggle Mode Interface that connects to the Toggle Mode interfaces of memory interface 228/258 for memory controller 102. In one embodiment, memory controller interface 315 includes a set of input and/or output (I/O) pins that connect to communication channel 322 (also refers to herein as a memory bus). In one embodiment, communication channel 322 connects to the memory controller 102 as part of the Toggle Mode Interface.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control module 316, a memory controller interface 315, storage region 318, ECC engine 330, and soft bit reference voltage calibration 334.

Soft bit reference voltage calibration 334 performs some or all of the functions to calibrate soft bit reference voltages 334. In some embodiments, some or all of the soft bit reference voltage calibration 334 is integrated into the state machine 312. In an embodiment, the soft bit reference voltage calibration 334 is able to calculate mutual information between data that was programmed into the memory structure and data sensed at candidate soft bit reference levels. In an embodiment, final soft bit reference levels are selected to maximize the mutual information. Maximizing the mutual information results in the final soft bit reference levels providing the most useful information for decoding data stored in the memory structure 326.

The ECC engine 330 is optional, and may be used to decode data that was programmed into the memory structure 326. In this manner, any errors in the data may be corrected in order to recover the original data that was programmed into the memory structure. The recovered original data may be used when calibrating soft bit refence levels. As noted, the ECC engine 330 is optional. In some embodiments of soft bit reference voltage calibration, the memory die 300 sends the encoded data to the memory controller 102 to decode. The memory controller 102 may then either calibrate the soft bit reference levels based on the error corrected data, or may send the recovered data to the memory die 300 such that the memory die (e.g., soft bit reference voltage calibration 334) may use the error corrected data to calibrate the soft bit reference levels.

State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. The default values and other parameters could be stored in a region of the memory structure 326 (e.g., structure parameter storage 326a).

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

Storage region 318 may be used to store parameters for operating the memory structure 326. Storage region 318 may include volatile or non-volatile memory. In some embodiments, the parameters include soft bit reference levels. The parameters may also include hard bit reference levels. The memory structure 326 has storage region 326a, which may also contain a copy of the parameters for operating the memory structure 326. In some embodiments, the parameters are copied from storage region 326a to storage region 318 when the memory die 300 is powered on.

In an embodiment, control circuitry 310, alone or in combination with read/write circuits 328 and decoders 324/332, are configured to connect to memory structure 326. The control circuitry 310, alone or in combination with read/write circuits 328 and decoders 324/332 are one example of one or more control circuit that perform the functions described below in the flow charts. In one embodiment, one or more control circuits comprising the memory controller 102 and control circuitry 310 perform the functions described below in the flow charts. In another embodiment, the one or more control circuits comprises state machine 312 (and/or a microcontroller and/or microprocessor) alone or in combination with memory controller 102. In another alternative, the one or more control circuits comprises memory controller 102, control circuitry 310, read/write circuits 328 and decoders 324/332 performing the functions described below in the flow charts. The term apparatus as used herein may include, but is not limited to, memory die 300, memory package 104, memory system 100, or a host system 120 that includes a memory system 100.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3B:
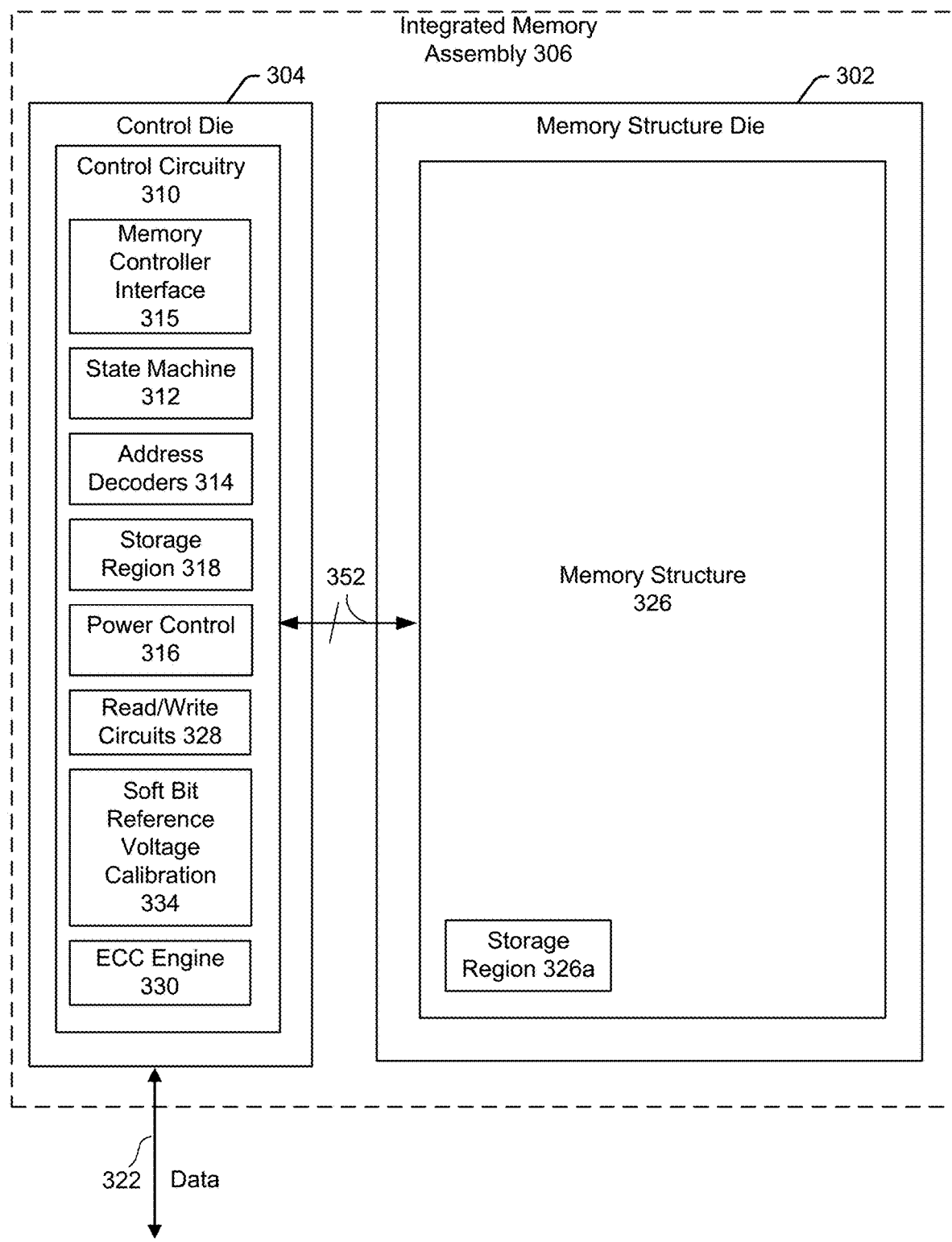
FIG. 3B is a functional block diagram of an embodiment of an integrated memory assembly.

FIG. 3B depicts a functional block diagram of one embodiment of an integrated memory assembly 306. The integrated memory assembly 306 may be used in a memory package 104 in memory system 100. In one embodiment, the integrated memory assembly 306 includes two types of semiconductor die (or more succinctly, "die"). Memory structure die 302 includes include memory structure 326. Memory structure 326 may contain non-volatile memory cells. Control die 304 includes control circuitry 310. In some embodiments, the control die 304 is configured to connect to the memory structure 326 in the memory structure die 302. For example, the control circuitry 310 is configured to be connected to non-volatile memory cells in memory structure 326 in memory structure die 302. In some embodiments, the memory structure die 302 and the control die 304 are bonded together. The control circuitry 310 includes state machine 312, an address decoder 314, a power control circuit 316, memory controller interface 315, storage region 318, soft bit reference voltage calibration 334, and ECC engine 330. Various elements in the control circuitry 310 have been described above with respect to FIG. 3A.

The control circuitry 310 also includes read/write circuits 328. In another embodiment, a portion of the read/write circuits 328 are located on control die 304, and a portion of the read/write circuits 328 are located on memory structure die 302.

Any subset of components in the control circuitry 310 of control die 304 can be considered one or more control circuits, which may perform the functions described below in the flowcharts. In another alternative, the one or more control circuits comprises controller 102 and control circuitry 310 of control die 304 performing the functions described below in the flow charts. The one or more control circuits can include hardware only or a combination of hardware and software (including firmware). For example, a controller programmed by firmware is one example of a control circuit. One or more control circuits can include a processor, PGA (Programmable Gate Array), FPGA (Field Programmable Gate Array), ASIC (Application Specific Integrated Circuit), integrated circuit or other type of circuit. The term apparatus as used herein may include, but is not limited to, control die 304, and integrated memory assembly 306.

Pathways 352 are pathways between one or more components in the control circuitry 310 and the memory structure on memory structure die 302. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal.

In one embodiment, integrated memory assembly 306 includes a set of input and/or output (I/O) pins that connect to communication channel 322 (also refers to herein as a memory bus). Communication channel 322 is depicted as being connected to control die 304. Communication channel 322 may connect to either or both of memory structure die 302 and/or control die 304. In one embodiment, communication channel 322 connects the memory controller 102 directly to control die 304.

Figure 3C:
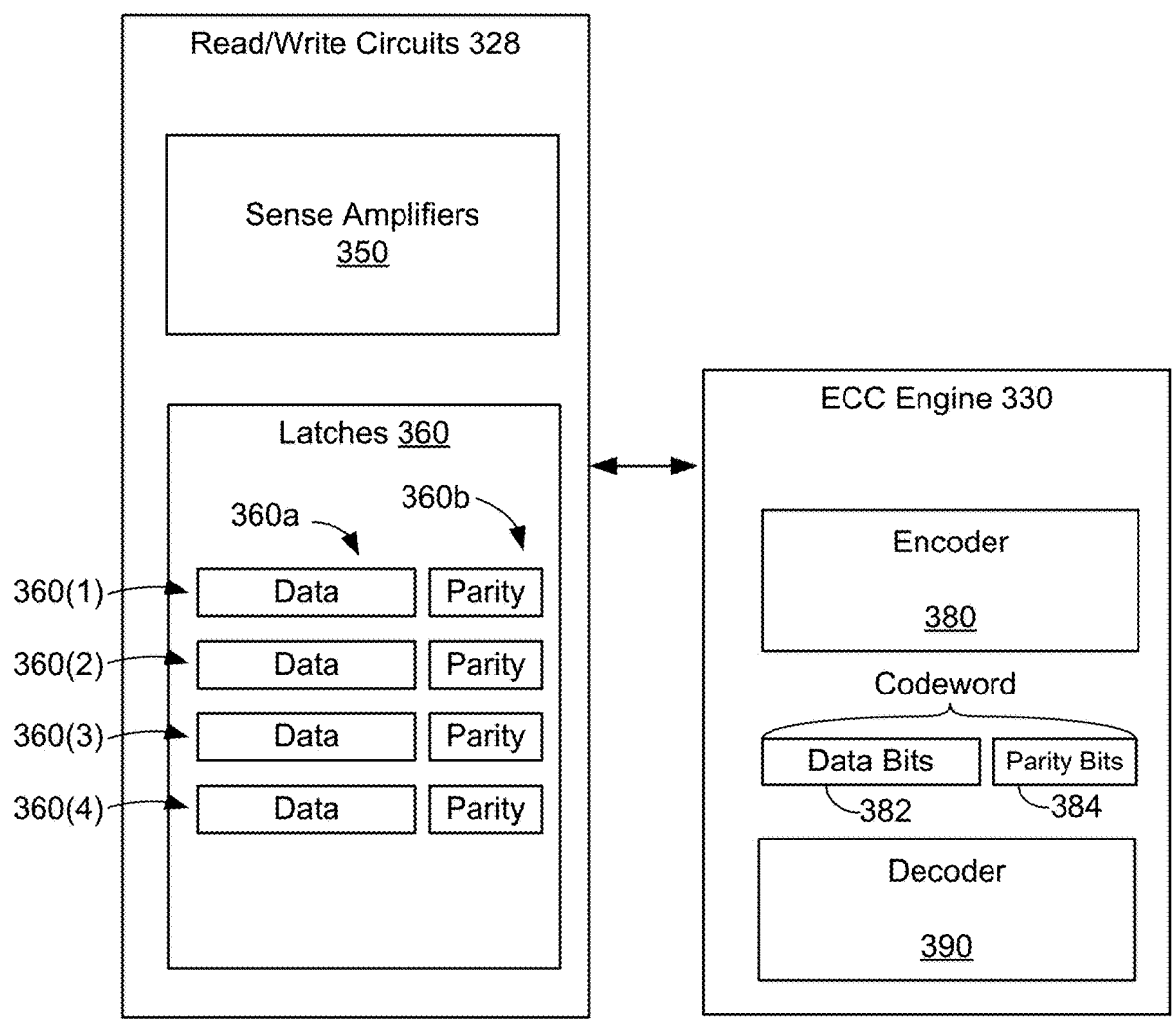
FIG. 3C is a block diagram of one embodiment of a read/write circuits and ECC of an integrated memory assembly.

FIG. 3C is a block diagram of one embodiment of the read/write circuits 328 and ECC engine 330 of the control die 304. The read/write circuits 328 have sense amplifiers 350 and latches 360. The latches 360 may include data latches 360a and parity latches 360b. In one embodiment, the data latches 360a store data bits of the codeword and the parity latches store parity bits of the codeword. It is not required that there be specific latches for data bits and for parity bits. FIG. 3C depicts four sets of data latches 360(1), 360(2), 360(3), 360(4). Each set may be used to store a codeword for a different page. In an embodiment in which four bits are stored per memory cell, four pages are stored in a set of memory cells. The four pages may be referred to as a lower page (LP), lower-middle page (LMP), upper-middle page (UMP), and an upper page (UP). In another embodiment, the sense amplifiers 350 are on the memory structure die 302, but the latches 360 are on the control die 304.

The on-die ECC engine 330 is able to encode data bits received from the memory controller 102. In one embodiment, the on-die ECC engine 330 forms codewords that each contain data bits and parity bits. In one embodiment, the memory controller 102 provides the codewords to the control die 304. The control circuitry 310 stores the codewords into non-volatile memory cells in the memory structure 326. The on-die ECC engine 330 decodes and error corrects codewords read from the memory structure 326. In some embodiments, the on-die ECC engine 330 is used during soft bit reference voltage calibration to recover data that was programmed into the memory structure 326.

In some embodiments, the on-die ECC engine 330 calculates parity bits for each unit of data (e.g., page) that is being stored. The parity bits (also referred to as an error correction code) may be stored with the unit of data (e.g., page). The combination of the unit of data and its associated parity bits are referred to as a codeword. In one embodiment, the parity bits are stored remotely from the unit of data (e.g., page).

The on die ECC engine 330 includes an encoder 380 and a decoder 390. The encoder 380 is configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The encoder 380 may form a codeword, which contains data bits 382 and parity bits 384. The data bits may be provided by the memory controller 102.

In one embodiment, the data bits 382 are stored in the data latches 360a, and the parity bits 384 are stored in the parity latches 360b. Based on the bits in the latches 360, the sense amplifiers 350 may control bit line voltages in the memory structure 326 when the non-volatile memory cells are being programmed. In this manner, the codewords may be programmed into non-volatile memory cells in the memory structure 326. It will be appreciated that other voltages may also be applied to the memory structure 326, such applying a program voltage to memory cells that are selected for programming.

The decoder 390 is configured to decode the codewords that were stored in the memory structure die 302. In one embodiment, sense amplifiers 350 sense bit lines in the memory structure 326 in order to read a codeword. The sense amplifiers 350 may store the read codeword into latches 360. The decoder 390 is able to detect and correct errors in the codeword.

Figure 4A:
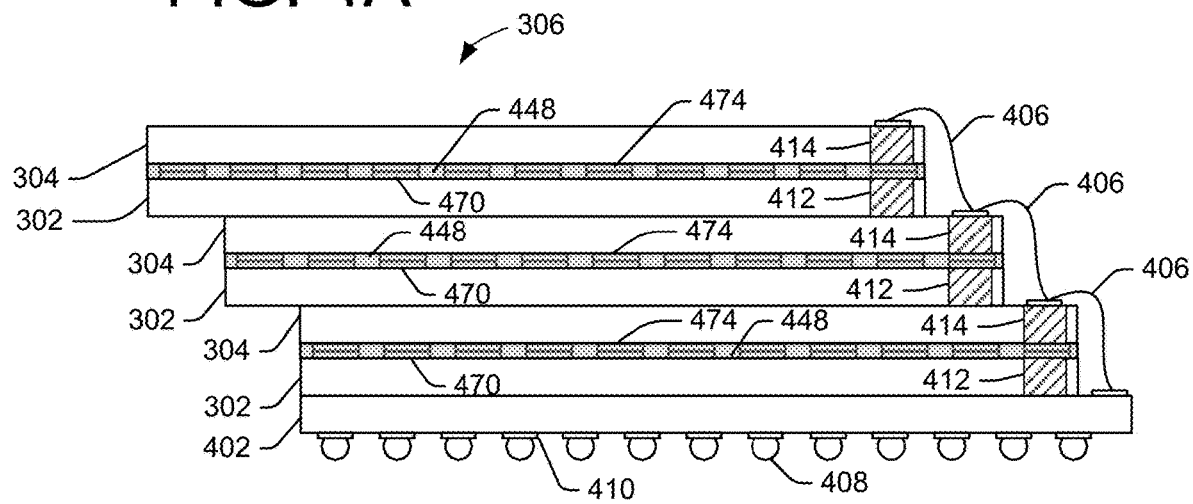
FIG. 4A depicts a side view of an embodiment of an integrated memory assembly stacked on a substrate.

In some embodiments, there is more than one control die 304 and more than one memory structure die 302 in an integrated memory assembly 306. In some embodiments, the integrated memory assembly 306 includes a stack of multiple control die 304 and multiple memory structure die 302. FIG. 4A depicts a side view of an embodiment of an integrated memory assembly 306 stacked on a substrate 402 (e.g., a stack comprising control dies 304 and memory structure dies 302). The integrated memory assembly 306 has three control dies 304 and three memory structure dies 302. In some embodiments, there are more than three memory structure dies 302 and more than three control die 304.

Each control die 304 is affixed (e.g., bonded) to at least one of the memory structure dies 302. Some of the bond pads 470, 474, are depicted. There may be many more bond pads. A space between two dies 302, 304 that are bonded together is filled with a solid layer 448, which may be formed from epoxy or other resin or polymer. This solid layer 448 protects the electrical connections between the dies 302, 304, and further secures the dies together. Various materials may be used as solid layer 448.

The integrated memory assembly 306 may for example be stacked with a stepped offset, leaving the bond pads at each level uncovered and accessible from above. Wire bonds 406 connected to the bond pads connect the control die 304 to the substrate 402. A number of such wire bonds may be formed across the width of each control die 304 (i.e., into the page of FIG. 4A).

A memory structure die through silicon via (TSV) 412 may be used to route signals through a memory structure die 302. A control die through silicon via (TSV) 414 may be used to route signals through a control die 304. The TSVs 412, 414 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 408 may optionally be affixed to contact pads 410 on a lower surface of substrate 402. The solder balls 408 may be used to electrically and mechanically couple the integrated memory assembly 306 to a host device such as a printed circuit board. Solder balls 408 may be omitted where the integrated memory assembly 306 is to be used as an LGA package. The solder balls 408 may form a part of the interface between the integrated memory assembly 306 and the memory controller 102.

Figure 4B:
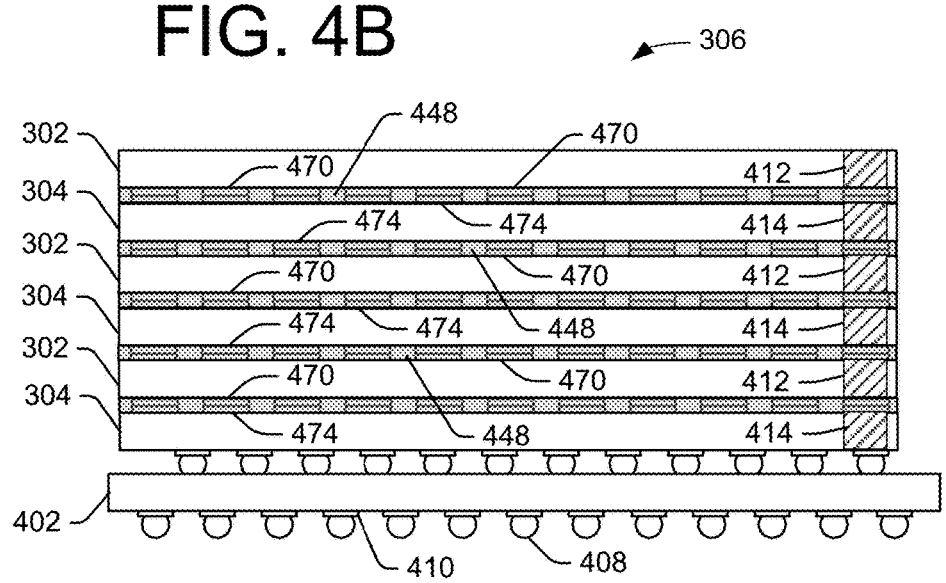
FIG. 4B depicts a side view of an embodiment of an integrated memory assembly stacked on a substrate.

FIG. 4B depicts a side view of an embodiment of an integrated memory assembly 306 stacked on a substrate 402. The integrated memory assembly 306 has three control die 304 and three memory structure die 302. In some embodiments, there are many more than three memory structure die 302 and many more than three control die 304. In this example, each control die 304 is bonded to at least one memory structure die 302. Optionally, a control die 304 may be bonded to two memory structure die 302.

Some of the bond pads 470, 474 are depicted. There may be many more bond pads. A space between two dies 302, 304 that are bonded together is filled with a solid layer 448, which may be formed from epoxy or other resin or polymer. In contrast to the example in FIG. 4A, the integrated memory assembly 306 in FIG. 4B does not have a stepped offset. A memory structure die through silicon via (TSV) 412 may be used to route signals through a memory structure die 302. A control die through silicon via (TSV) 414 may be used to route signals through a control die 304.

Solder balls 408 may optionally be affixed to contact pads 410 on a lower surface of substrate 402. The solder balls 408 may be used to electrically and mechanically couple the integrated memory assembly 306 to a host device such as a printed circuit board. Solder balls 408 may be omitted where the integrated memory assembly 306 is to be used as an LGA package.

As has been briefly discussed above, the control die 304 and the memory structure die 302 may be bonded together. Bond pads on each die 302, 304 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 302, 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material.

Figure 5:
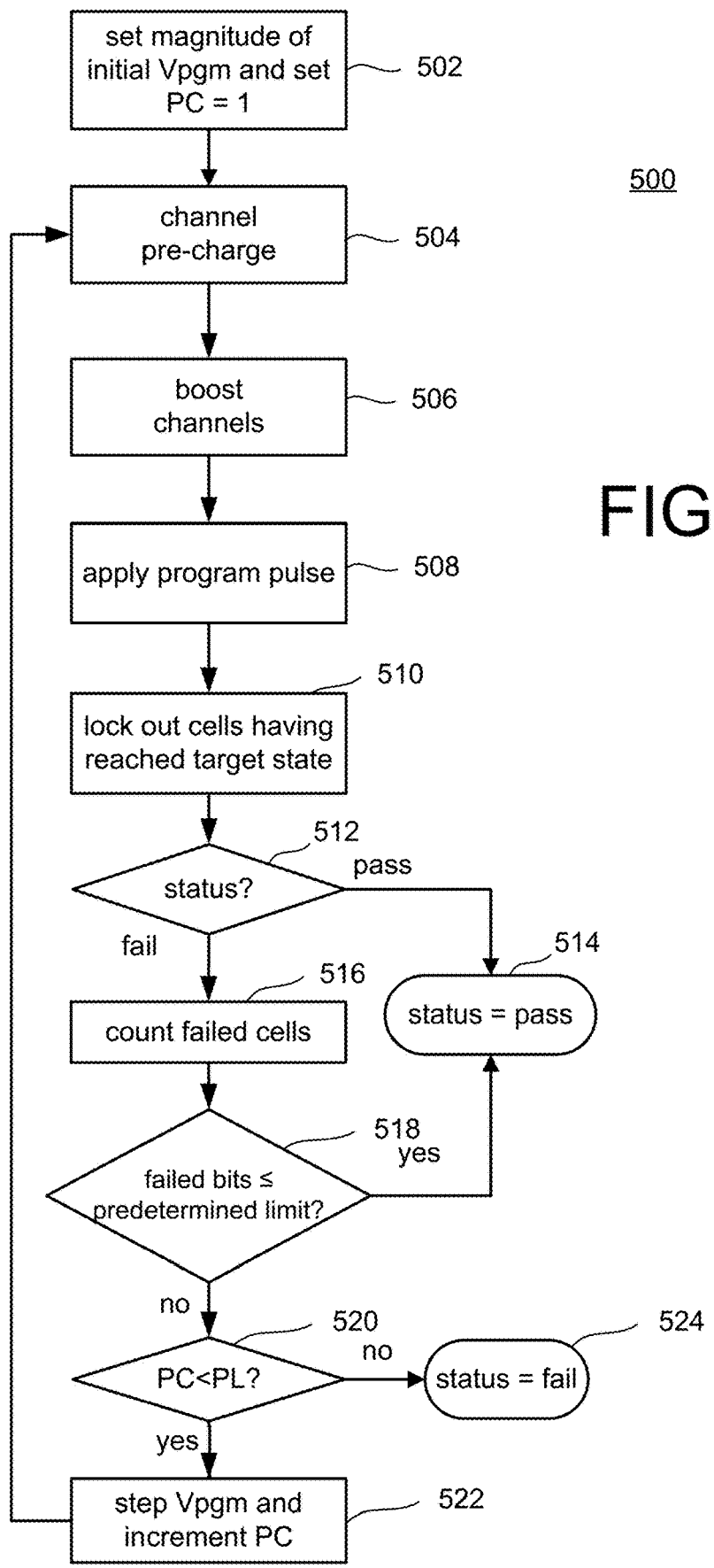
FIG. 5 is a flowchart describing one embodiment of a process for programming NAND strings of memory cells organized into an array.

FIG. 5 is a flowchart describing one embodiment of a process 500 for programming NAND strings of memory cells organized into an array. The process of FIG. 5 can be performed at the direction of state machine 312. In one example embodiment, the process of FIG. 5 is performed on memory die 300 using the control circuitry 310 (and read/write circuits 328, as well as decoders 332/324) discussed above. In one example embodiment, the process of FIG. 5 is performed by integrated memory assembly 306 using the control circuitry 310 discussed above. The process includes multiple loops, each of which includes a program phase (e.g., steps 504-508) and a verify phase (e.g., steps 510-518).

In many implementations, the magnitude of the program pulses is increased with each successive pulse by a predetermined step size. In step 502 of FIG. 5, the programming voltage (Vpgm) is initialized to the starting magnitude (e.g., ~12-16V or another suitable level) and a program counter PC maintained by state machine 312 is initialized at 1.

In one embodiment, the set of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 504 the memory system will pre-charge channels of NAND strings that include memory cells connected to the selected word line that are to be inhibited from programming.

In one embodiment, step 504 is the start of a program operation. In some embodiments, different sets of memory cells are programmed concurrently. For example, programming of memory cells in different memory structures 326 may be performed concurrently. In some embodiments, the start of concurrent program operations (e.g., step 504) is staggered such that step 504 occurs at different times for the different memory structures 326.

In step 506, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 508, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 508, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 510, memory cells that have reached their target states are locked out from further programming. Step 510 may include performing verifying at one or more verify reference levels. In one embodiment, the verification process is performed by testing whether the threshold voltages of the memory cells selected for programming have reached the appropriate verify reference voltage.

In step 510, a memory cell may be locked out after the memory cell has been verified (by a test of the Vt) that the memory cell has reached its target state.

If, in step 512, it is determined that all of the memory cells have reached their target threshold voltages (pass), the programming process is complete and successful because all selected memory cells were programmed and verified to their target states. A status of "PASS" is reported in step 514. Otherwise if, in step 512, it is determined that not all of the memory cells have reached their target threshold voltages (fail), then the programming process continues to step 516.

In step 516, the memory system counts the number of memory cells that have not yet reached their respective target threshold voltage distribution. That is, the system counts the number of memory cells that have, so far, failed to reach their target state. This counting can be done by the state machine 312, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 518, it is determined whether the count from step 516 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 514. In this situation, enough memory cells programmed correctly such that the few remaining memory cells that have not been completely programmed can be corrected using ECC during the read process. In some embodiments, the predetermined limit used in step 518 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 520 and the program counter PC is checked against the program limit value (PL). Examples of program limit values include 1, 12, 16, 19 and 30; however, other values can be used. If the program counter PC is not less than the program limit value PL, then the program process is considered to have failed and a status of FAIL is reported in step 524. If the program counter PC is less than the program limit value PL, then the process continues at step 522 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 522, the process loops back to step 504 and another program pulse is applied to the selected word line so that another iteration (steps 504-522) of the programming process of FIG. 5 is performed.

At the end of a successful programming process, the threshold voltages of the memory cells should be within one or more distributions of threshold voltages for programmed memory cells or within a distribution of threshold voltages for erased memory cells, as appropriate. FIG. 6A illustrates example threshold voltage distributions for the memory array when each memory cell stores three bits of data. Other embodiments, however, may use other data capacities per memory cell (e.g., such as one, two, four, or five bits of data per memory cell). FIG. 6A shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6A shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 6A also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 6A also shows Vev, which is a voltage level to test whether a memory cell has been properly erased.

In one embodiment, known as full sequence programming, memory cells can be programmed from the erased data state Er directly to any of the programmed data states A-G. For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state Er to data state B and/or from data state Er to data state C, and so on. The arrows of FIG. 6A represent the full sequence programming. In some embodiments, data states A-G can overlap, with control die 304 and/or memory controller 102 relying on error correction to identify the correct data being stored.

The technology described herein can also be used with other types of programming in addition to full sequence programming (including, but not limited to, multiple stage/phase programming). In one embodiment of multiple stage/phase programming, all memory cells to end up in any of data states D-G are programmed to an intermediate state that is no higher than D in a first phase. Memory cells to end up in any of data states Er-C do not receive programming in the first phase. In a second phase, memory cells to end up in either data state B or C are programmed to a state that is no higher than B; memory cells to end up in either data state F or G are programmed to a state that is no higher than F. In at third phase, the memory cells are programmed to their final states. In one embodiment, a first page is programmed in the first phase, a second page is programmed in the second phase, and a third page is programmed in the third phase. Herein, once on page has been programmed into a set of memory cells, the memory cells can be read back to retrieve the page. Hence, the intermediate states associated with multi-phase programming are considered herein to be programmed states.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 6A) or verify operation (e.g. see verify target levels VvA, VvB, VvC, VvD, VvE, VvF, and VvG of FIG. 6A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 6B depicts threshold voltage distributions and one page mapping scheme when each memory cell stores four bits of data. FIG. 6B depicts that there may be some overlap between the data states S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. However, by recalibrating soft bit reference levels, as disclosed herein, decoding time and success rate is improved.

As noted, FIG. 6B depicts an example in which four bits are stored per memory cell. Thus, four pages may be stored in a set of memory cells. Fifteen hard bit (HB) read reference levels are depicted (Vr1-Vr15). The set of memory cells may be connected to the same word line. Each HB read reference levels is used to distinguish between two adjacent threshold voltage distributions. Stated another way, each HB read reference levels is used to distinguish between two adjacent data states. For example, HB read reference level Vr4 is used to distinguish between data states S3 and S4.

FIG. 6B also depicts soft bit (SB) reference levels associated with four of the HB reference levels. Those four HB reference levels may be those used to sense one page of data. There is one set of SB reference levels grouped around each of Vr1, Vr4, Vr6, and Vr11. For example, the set of SB reference levels Vr1_s1, Vr1_s2, Vr1_s3, and Vr1_s4 are grouped around HB reference level Vr1; the set of SB reference levels Vr4_s1, Vr4_s2, Vr4_s3, and Vr4_s4 are grouped around HB reference level Vr4; the set of SB reference levels Vr6_s1, Vr6_s2, Vr6_s3, and Vr6_s4 are grouped around HB reference level Vr6; and the set of SB reference levels Vr11_s1, Vr11_s2, Vr11_s3, and Vr11_s4 are grouped around HB reference level Vr11. There may be SB reference levels associated with the other HB reference levels, but they are not depicted in FIG. 6B. In FIG. 6B, there are four SB reference levels associated with each corresponding HB reference level, but there could be more or fewer SB reference levels associated with a HB reference level. In FIG. 6B there are an equal number of SB reference levels on each side of a corresponding HB reference level, but this is not a requirement. For example, sensing at a SB reference level on just one side of the corresponding HB reference level can provide useful reliability information.

Note that although some embodiments disclosed herein are directed to memory cells in which the state is represented by a threshold voltage (Vt) of the memory cell, the state of the memory cell may be represented by another physical parameter including, but not limited to, resistance or conductance. For example, in FIGS. 6A and 6B, the data states are represented by Vt distributions. However, for other types of memory cells the data states may be represented by resistance distributions or conductance distributions.

In some embodiments, the SB reference voltages are used to read data in the memory cells when the ECC engine is not able to decode a codeword stored in the memory cells using data sensed using the HB reference voltages. Typically, there is a set of SB reference voltages for each HB reference voltage. A SB reference voltage is at a slightly higher voltage or a slightly lower voltage than a corresponding HB reference voltage. Herein, a SB reference voltage that is at a slightly higher voltage than a corresponding HB reference voltage is referred to as an "upper SB reference voltage." Herein, a SB reference voltage that is at a slightly lower voltage than a corresponding HB reference voltage is referred to as an "lower SB reference voltage." In some embodiments, there is one or more upper SB reference voltages and one or more lower SB reference voltages for a corresponding HB reference voltage. One embodiment is a one-sided SB read, in which only an upper SB reference voltage(s) or only a lower SB reference voltage(s) is used. For example, sensing can take place at one or more lower SB reference voltages for each HB reference voltage. Alternatively, sensing can take place at one or more upper SB reference voltages for each HB reference voltage.

The set of SB reference voltages are used to generate "soft" reliability information, which increases the correction capability of the decoder. Sensing at the SB reference voltages generates one or more "soft bits" for each memory cell, which indicate whether the physical parameter (e.g., Vt, resistance) of a memory cell close to the HB reference level making the HB for that memory cell less reliable, or far from the HB reference level making the HB more reliable. In other words, if the soft reliability information indicates that a memory cell has its value for a physical parameter close to the HB reference level, then this is considered less reliable than if the soft reliability information indicates that a memory cell has its value for a physical parameter far from the HB reference level.

However, this correction capability depends on the quality of the soft reliability information. Using soft bits that were not sensed in the correct location (e.g., correct voltage level) can degrade the quality of the soft reliability information and make it less informative. Setting the location of the SB thresholds is a trade-off. If the SB thresholds are too close to the HB threshold, then many of the errors are not marked as low reliability. FIG. 7A depicts an example in which the SB reference levels might be set too close to the HB threshold. FIG. 7A depicts two adjacent memory cell distributions 702, 704. These two adjacent memory cell distributions 702, 704 correspond to two adjacent data states. In one embodiment, each memory cell distribution 702, 704 is a Vt distribution. In one embodiment, each memory cell distribution 702, 704 is a resistance distribution. The horizontal axis is labeled as "Sense Voltage" to indicate that, in some embodiments, a voltage is used to sense the memory cells. The sense voltage may be used to test a physical parameter of the memory cells such as, for example, Vt, resistance, or conductance. Sensing the physical parameter of the memory cells is not limited to using a voltage.

Hard bit reference level 706 is used to distinguish between the two adjacent memory cell distributions 702, 704. Stated another way, the HB reference level 706 is used to distinguish between the two adjacent data states. Two SB reference levels 708a, 708b are depicted. In one embodiment, the HB reference level 706 is a voltage that is used to distinguish between two Vt distributions. In one embodiment, the HB reference level 706 is a voltage that is used to distinguish between two resistance distributions. Hence, depending on the physical parameter of the memory cell that is being tested, the HB reference level 706 may correspond to a Vt of a memory cell, a resistance of a memory cell, or some other physical parameter of the memory cell. Similar reasoning applies to the SB reference levels 708.

Region 710 corresponds to a portion of the memory cells in memory cell distribution 704 that are in error because they have a value for a physical parameter (e.g., Vt, resistance) below the HB reference level 706. Stated another way, region 710 corresponds to a portion of the memory cells that were intended to be programmed to the data state associated with memory cell distribution 704, but now have a value for the physical parameter below the HB reference level 706. However, since the memory cells in region 710 also have a value for the physical parameter below the SB reference level 708a, they fall into a high reliability category. However, it is desirable to have such memory cells flagged as low reliability. Note that a phrase such as, "a memory cell has a resistance below the HB reference level 706" means that the resistance of the memory cell is below the resistance being tested by the HB reference level 706. Note that a phrase such as, "a memory cell has a Vt below the HB reference level 706" means that the Vt of the memory cell is below the Vt being tested by the HB reference level 706.

Region 712 corresponds to a portion of the memory cells in memory cell distribution 702 that are in error because they have a value for the physical parameter above the HB reference level 706. Stated another way, region 712 corresponds to some of the memory cells that were intended to be programmed to the data state associated with memory cell distribution 702, but now have a value for the physical parameter above the HB reference level 706. However, since the memory cells in region 712 also have a value for the physical parameter above the SB reference level 708b, they fall into a high reliability category. However, it is desirable to have such memory cells flagged as low reliability.

On the other hand, if the SB thresholds are too far from the HB threshold, then too many correct bits are marked as unreliable. FIG. 7B depicts an example in which the SB thresholds might be set too far from the HB threshold. FIG. 7B depicts two adjacent memory cell distributions 702, 704. Hard bit (HB) reference level 706 is used to distinguish between the two adjacent memory cell distributions 702, 704. Two SB reference levels 714a, 714b are depicted. Region 716 corresponds to a portion of the memory cells in memory cell distribution 702 that are correct because they have a value for the physical parameter below the HB reference level 706. However, since the memory cells in region 716 also have a value for the physical parameter above the SB reference level 714a, they fall into a low reliability category. However, it is desirable to have fewer non-erroneous memory cells flagged as low reliability. In other words, SB reference level 714a is set too far below the HB reference level 706. Region 718 corresponds to a portion of the memory cells in memory cell distribution 704 that are correct because they have a value for the physical parameter above the HB reference level 706. However, since the memory cells in region 718 have a value for the physical parameter below the SB reference level 714b, they fall into a low reliability category. However, it is desirable to have fewer non-erroneous memory cells flagged as low reliability. In other words, SB reference level 714b is set too far above the HB reference level 706.

Figure 8A:
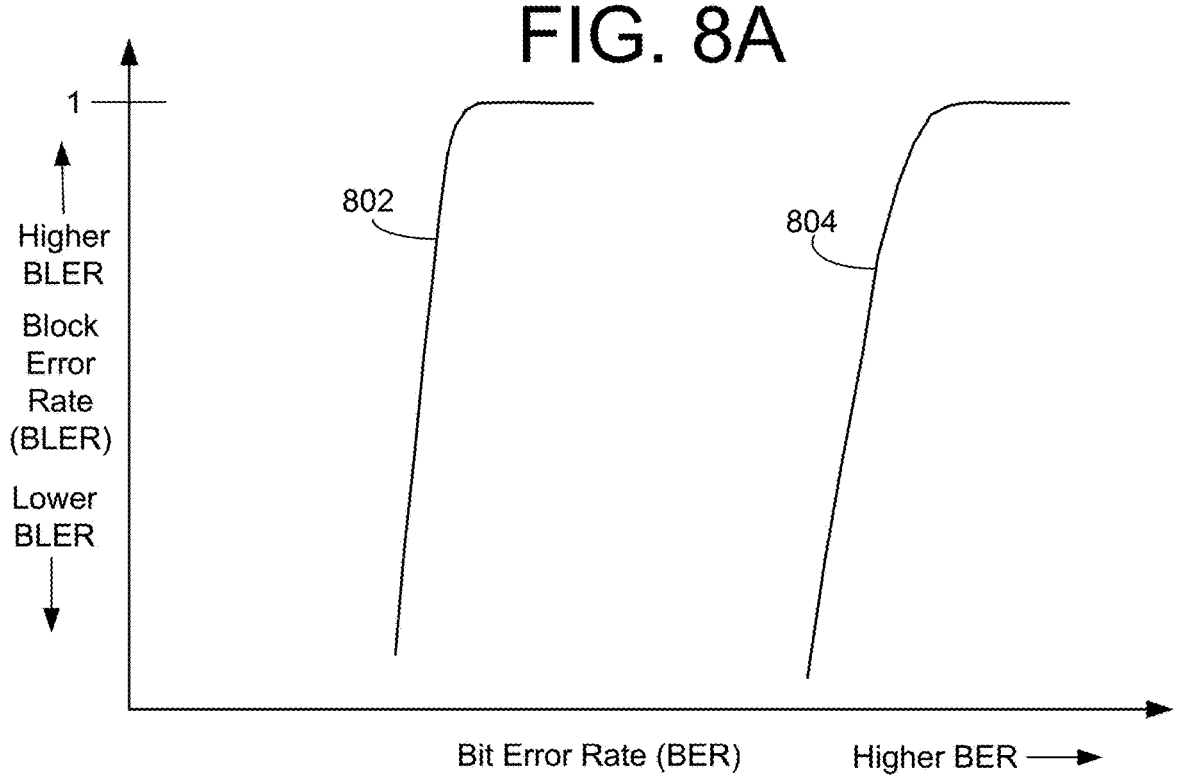
FIG. 8A depicts curves of bit error rates (BER) versus block error rate (BLER).

As noted above, SBs can indicate reliability of a HB for each memory cell. FIG. 8A depicts curves of block error rate (BLER versus bit error rates (BER). The vertical axis is for block error rate (BLER) which is the probability the decoder will fail decoding a code-word. Error correction resulting in a low BLER is desirable. The horizontal axis is for bit error rate (BER) which is the amount of errors in the codeword. Error correction that is able to correct data having a higher BER is desirable. In other words, having a low BLER for a high BER is desirable. Curve 802 corresponds to using only HBs during error correction. Curve 804 corresponds to using both HBs and SBs during error correction. For curve 804 it is assumed that the SB reference levels are established at suitable levels for good error correction. The curves 802, 804 illustrate that using both HBs and SBs significantly increases the error correction ability. For example, for two points on the curves 802, 804 having the same BLER, curve 804 corresponds to a higher BER. Thus, curve 804 illustrates that using both HBs and SBs can correct data having a higher BER than using only HBs, while achieving the same BLER.

Figure 8B:
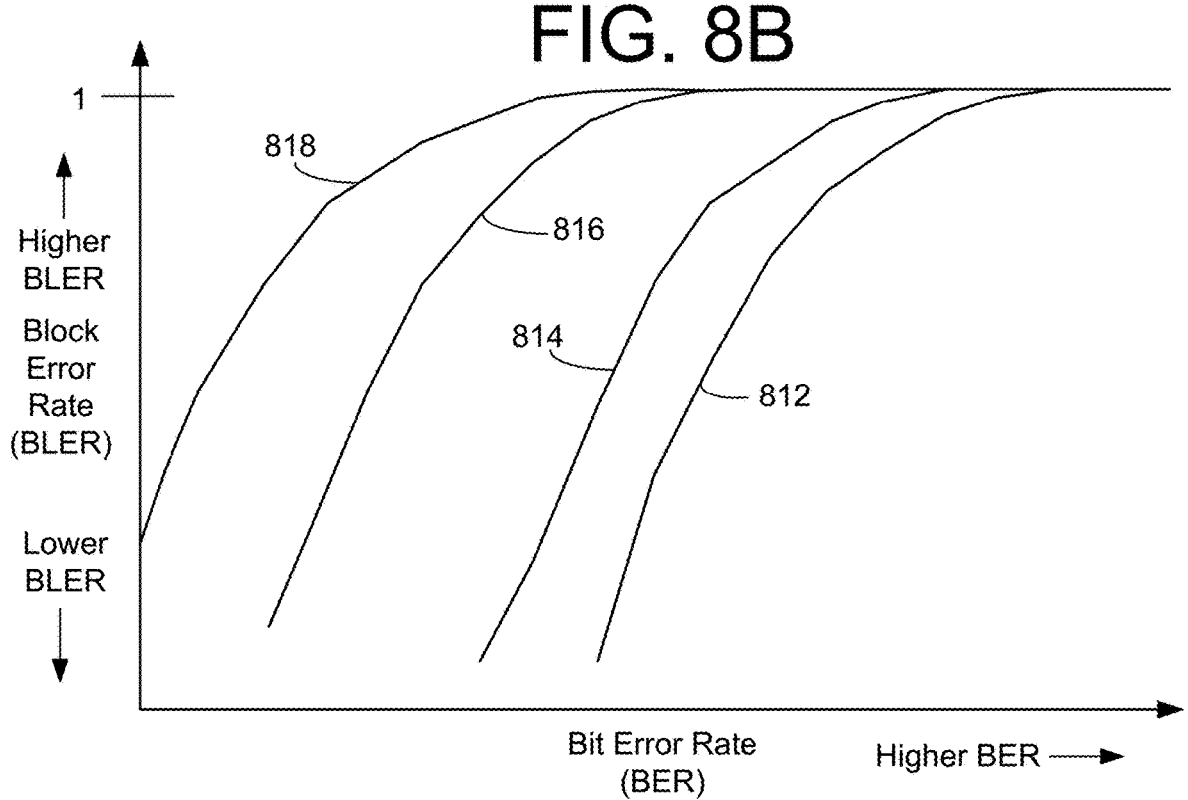
FIG. 8B depicts curves of BER versus BLER for different locations of the soft bit reference levels.

However, the location of the SB reference levels has a significant impact on the ability of the SBs to improve the error correction. FIG. 8B depicts curves of BER versus BLER for different locations of the SB reference levels. The vertical axis is for block error rate (BLER). The horizontal axis is for bit error rate (BER). However, note that the scale (values) for BER in FIG. 8B do not necessarily correspond to those in FIG. 8A. Curve 812 represents the best location for the SB reference levels, curve 814 represents the second best location for the SB reference levels of those depicted, curve 816 represents the third best location for the SB reference levels of those depicted, and curve 818 represents the worst location for the SB reference levels of those depicted. These curves 812-818 indicate that if the location of the SB reference levels are not correctly chosen, then the error correction ability decreases.

Figure 9:
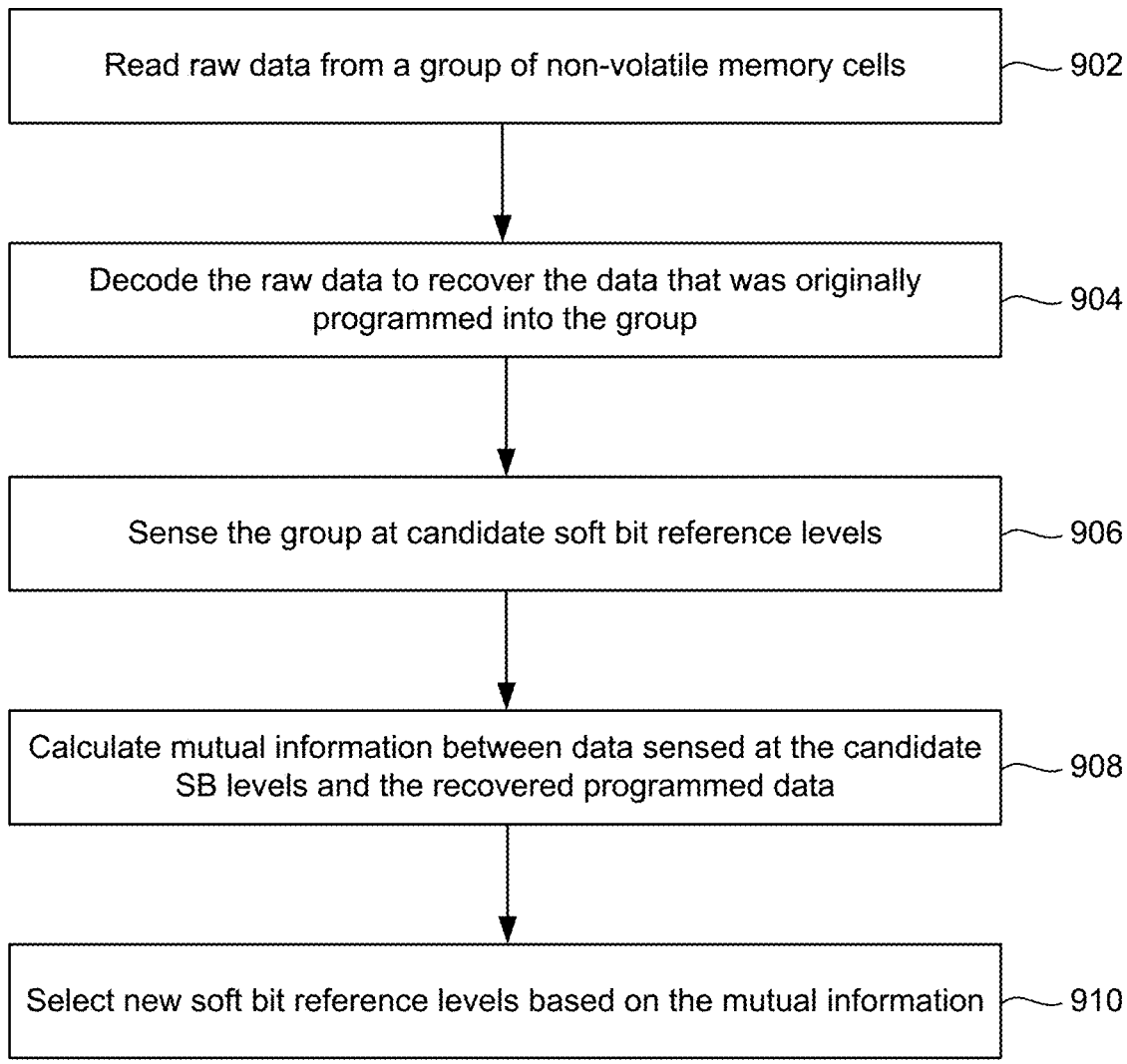
FIG. 9 depicts a flowchart of one embodiment of a process of calibrating soft bit reference levels.

FIG. 9 depicts a flowchart of one embodiment of a process 900 of calibrating SB reference levels based on original data that was programmed into non-volatile memory cells. The original data may be obtained by decoding encoded data stored in the memory cells. Decoding the encoded data corrects any errors in the data, thereby generating the original data that was programmed into the memory cells. Calibrating SB reference levels based on the original data improves the quality of the reliability information (e.g., soft bits) derived from sensing non-volatile memory cells at the calibrated soft bit reference levels.

The process 900 may be used for memory cells that store one bit per cell (e.g., SLC) or multiple bits per cell (e.g., two, three, four, or more bits per cell). Typically, a set of one or more SB reference levels is associated with (e.g., grouped around) a HB reference level. There may be any number of SB reference levels in the set. In one embodiment, the final calibrated SB reference levels have one SB reference level on each side of the corresponding HB reference level. In one embodiment, the final calibrated SB reference levels have two SB reference levels on each side of the corresponding HB reference level. In one embodiment, the final calibrated SB reference levels have three SB reference levels on each side of the corresponding HB reference level. One-sided SB reference levels are also possible. In one embodiment, the final calibrated SB reference levels have one or more lower SB reference levels for each corresponding HB reference level (with upper SB reference levels not required). In one embodiment, the final calibrated SB reference levels have one or more upper SB reference levels for each corresponding HB reference level (with lower SB reference levels not required). The process 900 may be used to calibrate the SB reference levels associated with HB reference levels used to read a page of data. For example, with respect to the example in FIG. 6B, the process 900 may be used to calibrate the SB reference levels associated with Vr1, Vr4, Vr6, and Vr11. However, for ease of explanation calibration of the SB reference levels associated with one of the HB reference levels may be discussed. In some examples, the discussion will focus on calibrating a SB reference voltage on one side of a HB reference voltage.

In one embodiment, process 900 is triggered in response to not being able to decode data that was read from some set of memory cells. For example, there could be a decoding failure somewhere in a block of memory cells. This could be a failure to decode using both HBs and SBs, for example. After calibrating the SB reference levels in process 900, another attempt may be made to decode the data using both HBs and SBs. Calibrating the SB reference levels helps to recover from the original failure to decode using both HBs and SBs. However, process 900 may be performed without having a decoding failure.

Step 902 includes sensing data from a group of non-volatile memory cells. In an embodiment, at least one page of data is read. The page of data may be stored in the memory cells as an ECC codeword. Note that in an embodiment in which process 900 is triggered by a decoding failure, this decoding failure is for a different codeword than is sensed in step 902. For example, the group that is sensed in step 902 could be a different group of memory cells than the group for which there was a decoding failure. If the group of memory cells store multiple codewords, the codeword that is sensed in step 902 could be a different codeword than the codeword for which decoding failed in the group. The memory cells may be sensed at one or more HB reference levels. For example, with respect to FIG. 6B, the memory cells may be sensed at Vr1, Vr4, Vr6, and Vr11 to sense one page of data. Thus, one ECC codeword is read. The process 900 may be repeated for other pages of data stored in the memory cells. For example, sensing may occur at the HB reference levels for one of the pages, followed by sensing at the HB reference levels for another page, etc. After sensing for one page, a HB may be determined for each memory cell. The HBs may be determined by sense blocks 350. The HBs are provided to an ECC decoder. The ECC decoder may be located in memory controller 102, on the control die 304, or on the memory die 300.

Optionally, in step 902 the memory cells may be sensed at the present levels of the SB reference levels. If SB reference levels are used, then the sense blocks 350 may determine one or more SBs for each memory cell. The SBs are provided to the ECC decoder.

Step 904 includes decoding the encoded data to recover the original data that was programmed into the group of memory cells. Step 904 may include decoding an ECC codeword that was stored in the memory cells. The ECC decoder will correct any errors in the encoded data. In the event that the ECC decoder is unable to correct all of the errors using only the HBs, the present values of the SBs may be used. Optionally, a different group of memory cells could be selected if there is difficulty in decoding the codeword. For example, a different group in the same block could be selected, with steps 902-904 repeated. Step 904 results in the recovery of the original programmed data.

Figure 10:
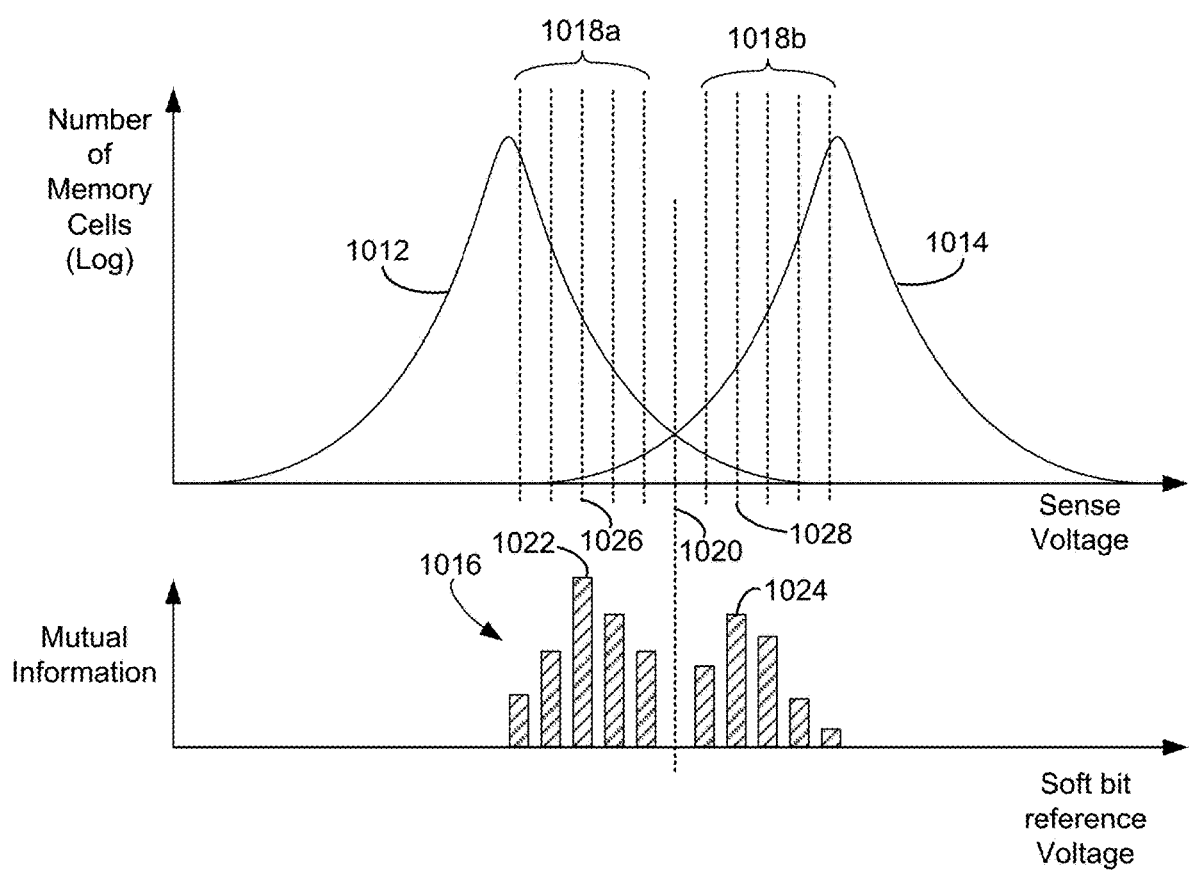
FIG. 10 depicts threshold distributions with candidate soft bit reference levels associated with a hard bit reference level.

Step 906 includes sensing the group of non-volatile memory cells at candidate SB reference levels. FIG. 10 depicts an example of candidate SB reference levels associated with a HB reference level. Note that there are lower candidate SB reference voltages 1018$a$ and upper candidate SB reference voltages 1018$b$ in this example. There may be a set of candidate SB reference levels for each HB reference level. In a lower-side SB embodiment, there are lower candidate SB reference voltages 1018$a$ (with upper candidates 1018$b$ not required). In an upper-side SB embodiment, there are upper candidate SB reference voltages 1018$b$ (with lower candidates 1018$a$ not required). In some cases, process 900 is used to calibrate the SB reference levels that are used when reading a page of data. When there is more than one bit per cell, reading the page may involve reading at more than one HB reference level, each with its own SB reference levels. In this case, step 906 may include sensing at a set of candidate SB reference levels for each of the HB reference levels needed to read the page. In one embodiment, step 906 is performed by control circuitry 310 on the memory die 300. In one embodiment, step 906 is performed by control circuitry 310 on the control die 304.

Step 906 results in data for each of the candidate SB reference levels. The data for each candidate SB reference level is based on sensing at the respective candidate SB reference level, but may also be based on sensing at other reference levels. For example, with reference to FIG. 10, the data for candidate SB reference level 1026 may be based on sensing at SB reference level 1026, HB reference level 1020, and SB reference level 1028.

Step 908 includes calculating mutual information (MI) between the recovered programmed data and the data sensed for the candidate SB reference levels. The MI serves as a good measure for how well the candidate set of SB reference levels will aid in decoding the data. Calibrating the SB reference levels based on the MI improves the quality of the reliability information (e.g., soft bits). In one embodiment, the MI is based on a channel transition matrix. Further details of an embodiment of calculating the MI based on a channel transition matrix is shown and described with respect to FIGS. 11 and FIG. 12A-12E. In one embodiment, the MI is based on log likelihood ratios. Further details of an embodiment of calculating the MI based on log likelihood ratios is shown and described with respect to FIG. 13.

Step 910 includes selecting new SB reference levels based on the MI. In an embodiment, a candidate SB reference level for which the MI among a set of candidate SB reference levels was highest are selected. This selection may be done separately for the lower candidate SB reference voltages 1018a and the upper candidate SB reference voltages 1018b for each HB reference level. For example, in FIG. 10, SB reference level 1026 may be selected from the lower candidate SB reference levels 1018a. Similarly, SB reference level 1028 may be selected from the upper candidate SB reference levels 1018b. The new SB reference level is not required to be one of the candidate SB reference levels. For example, the new SB reference level could be midway between two candidate SB reference levels. In one embodiment, step 910 is performed by control circuitry 310 on the memory die 300. In one embodiment, step 910 is performed by control circuitry 310 on the control die 304. In one embodiment, step 910 is performed by memory controller 102.

FIG. 10 will now be discussed in further detail. FIG. 10 depicts two memory cell distributions 1012, 1014. FIG. 10 also depicts a graph of MI 1016 versus SB reference voltage. The two memory cell distributions 1012, 1014 could be the two cell distributions for a case in which the memory cells each store one bit (SLC), or two of the cell distributions when each memory cell stores multiple bits per cell (e.g., two, three, four, etc. bits per cell). In one embodiment, the two memory cell distributions 1012, 1014 are two adjacent distributions in FIG. 6B. For example, distribution 1012 might correspond to S3 and distribution 1014 might correspond to S4.

One HB reference voltage 1020 and ten candidate SB reference voltages 1018 are depicted. In one embodiment of step 906 in FIG. 9, the memory cells are sensed at the ten SB reference voltages 1018. There could be more or fewer than ten candidate SB voltages 1018. There a five lower candidate SB reference voltages 1018a, which each have a lower voltage than the HB reference voltage 1020. There a five upper candidate SB reference voltages 1018b each having a higher voltage than the HB reference voltage 1020. An example will be discussed in which one of the candidates on each side of the HB reference voltage 1020 will be selected as a new SB reference voltage. However, the new SB reference voltage might be a weighted average of the two candidates with the two highest values for the MI. The weights may be based on the MI for the two candidates. For example, if the MI is slightly higher for one of the two candidates, then the new SB reference level may be closer to that candidate. The new SB reference voltages could be, for example, Vr4_s2 and Vr4_s3 in FIG. 6B. However, in some embodiments, more than two SB reference voltages can be used for a given HB reference voltage. For example, in FIG. 6B, there are also Vr4s1 and Vr4S4 associated with Vr4. In some embodiments, those additional SB reference voltages are also calibrated separately from calibrating Vr4_s2 and Vr4_s3.

The mutual information (MI) 1016 has MI for each SB reference level 1018. The MI for a particular SB reference voltage 1018 is a statistical measure of how useful the reliability information (e.g., soft bit) associated with that SB reference voltage will be. In other words, the MI indicates how helpful the SB reference voltage will be in decoding data. The higher the MI the more useful the reliability information from the corresponding SB reference voltage will be.

Mutual information 1022 is the highest for any of the lower candidate SB reference levels 1018a. Mutual information 1022 corresponds to SB reference level 1026. Thus, this is the MI between data sensed using the HB reference level 1020 and SB reference level 1026 and the original data programmed into the memory cells. Hence, SB reference level 1026 may be selected as a new SB reference level.

Mutual information 1024 is the highest for any of the upper candidate SB reference levels 1018b. Mutual information 1024 corresponds to SB reference level 1028. Thus, this is the MI between data sensed using the HB reference level 1020 and SB reference level 1028 and the original data programmed into the memory cells. Hence, SB reference level 1028 may be selected as a new SB reference level.

Hence, returning to the discussion of step 910 of FIG. 9, a new lower SB reference level 1026 may be selected. Likewise, a new upper SB reference level 1028 may be selected. Note that the lower SB reference level 1026 may be selected independent of the upper SB reference level 1028, such that the two can be at different voltage gaps (or soft bit deltas) from the HB reference voltage 1020. Moreover, lower and upper SB reference levels may be selected for each HB reference voltage associated with the page of data that was read from the memory cells in step 902.

Figure 11:
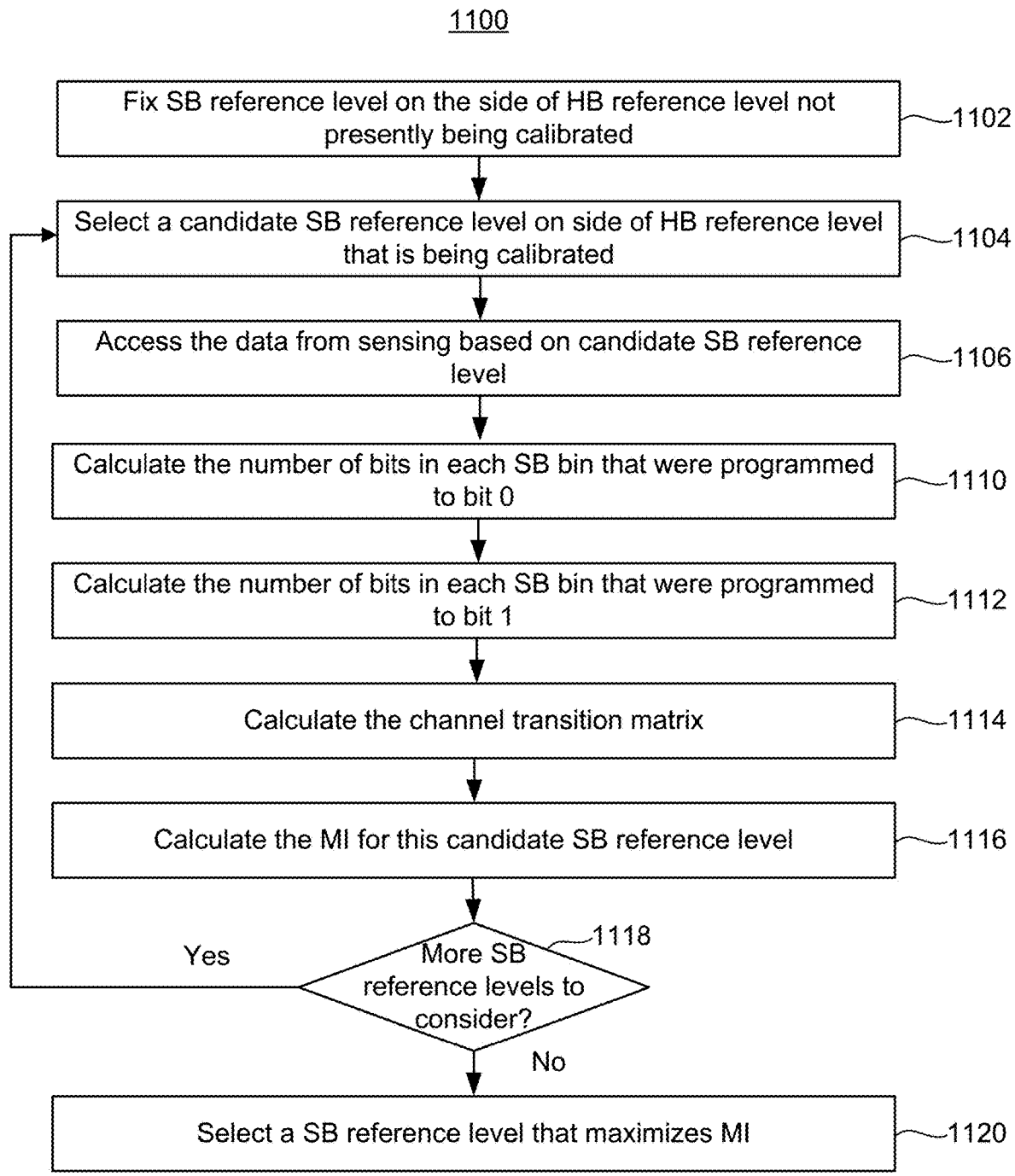
FIG. 11 is a flowchart of one embodiment of a process in which mutual information is calculated based on a channel transition matrix.

In some embodiments, the MI is calculated based on a channel transition matrix. FIG. 11 is a flowchart of one embodiment of a process 1100 in which MI is calculated based on a channel transition matrix. Process 1100 provides further details for one embodiment of step 908. Step 1102 includes fixing the SB reference voltage on the side of the HB reference voltage that is not presently being calibrated. Fixing the SB reference voltage means that the SB reference voltage is not changed during process 1100. In the examples of FIGS. 12A-12E, the lower SB reference voltage is being calibrated (from candidates 1018a). The upper SB reference voltage is fixed at upper SB reference voltage 1206.

Step 1104 includes selecting a candidate SB reference voltage on the side of the HB reference voltage that is being calibrated. With reference to FIGS. 12A-12E, in each case a different candidate is selected from the lower candidate SB reference voltages 1018a.

Step 1106 includes accessing data from sensing at a candidate SB reference voltage. The data may be based on sensing at more than just the candidate SB reference voltage. For example, for FIG. 12A, the candidate is lower candidate SB reference voltage 1204. However, the data may be also based on sensing at HB reference voltage 1020, and the fixed upper SB reference voltage 1206.

Figure 12A:
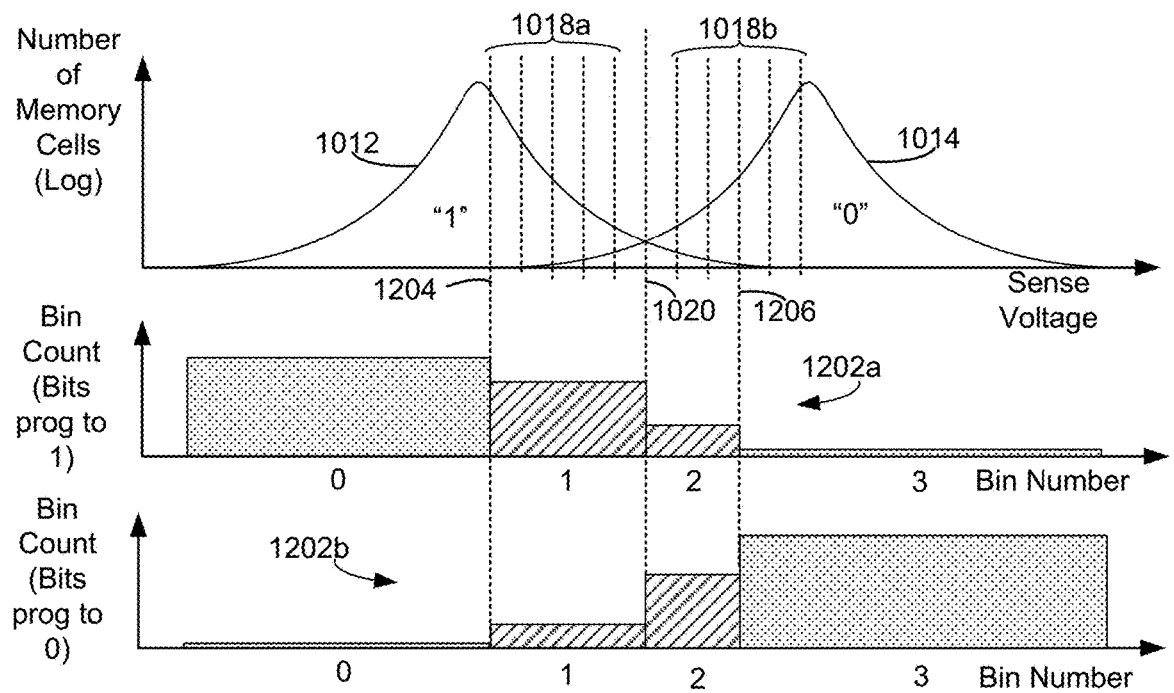
FIG. 12A-12E show example of bin counts for five different candidate soft bit reference levels.

Step 1110 includes calculating the number of bits in each SB bin that were programmed to bit 0. Step 1112 includes calculating the number of bits in each SB bin that were programmed to bit 1. For purpose of discussion, it will be assumed that memory cells programmed to 1 should have a Vt below the HB reference voltage 1020, and the memory cells programmed to 0 should have a Vt above the HB reference voltage 1020. For example, FIG. 12A shows distribution 1012, which represents memory cells that were programmed to "1". Most of those memory cells do have a Vt below the HB reference voltage 1020, but a few have a Vt above the HB reference voltage 1020. Likewise, FIG. 12A shows distribution 1014, which represents memory cells that were programmed to "0". Most of those memory cells have a Vt above the HB reference voltage 1020, but a few have a Vt below the HB reference voltage 1020.

FIG. 12A-12E show examples of bin counts for five different candidate SB reference levels. FIG. 12A shows eight bins for when SB reference voltage 1204 is being analyzed. In this example, SB reference voltage 1206 is fixed. Four bins 1202a represent counts of memory cells that were originally programmed to "1". Four bins 1202b represent counts of memory cells that were originally programmed to "0". Each bin 1202 is defined based on the reference voltages. Bin 0 is used to count memory cells having a Vt below SB reference voltage 1204. Note that for purpose of explanation, an example of testing threshold voltages of memory cells is tested, but a different parameter such as resistance could be tested for a different type of memory cell. Bin 1 is used to count memory cells having a threshold voltage between SB reference voltage 1204 and the HB reference voltage 1020. Bin 2 is used to count memory cells having a threshold voltage between the HB reference voltage 1020 and SB reference voltage 1206. Bin 3 is used to count memory cells having a threshold voltage above SB reference voltage 1206.

Figure 12B:
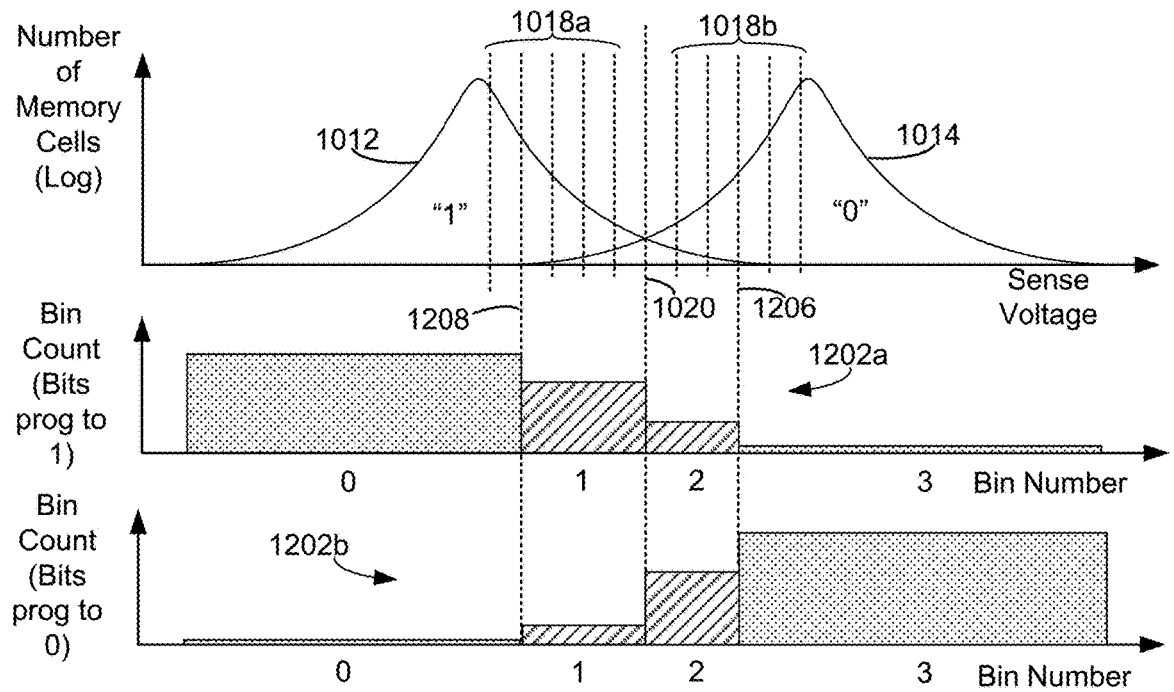
Figure 12C:
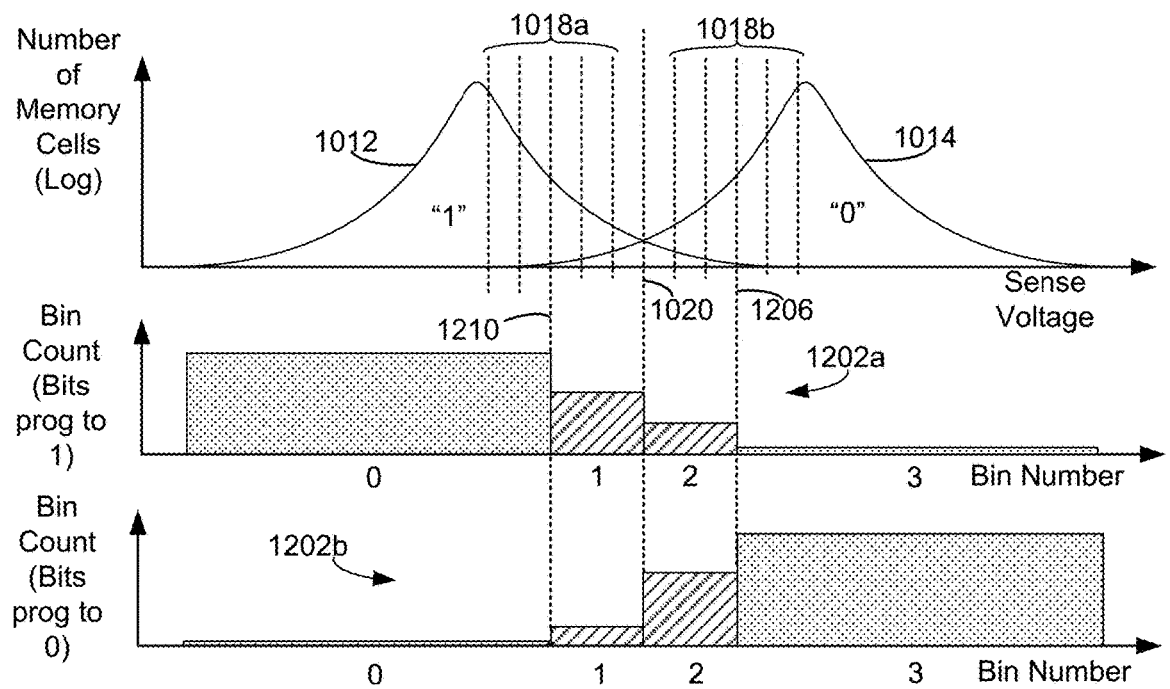
Figure 12D:
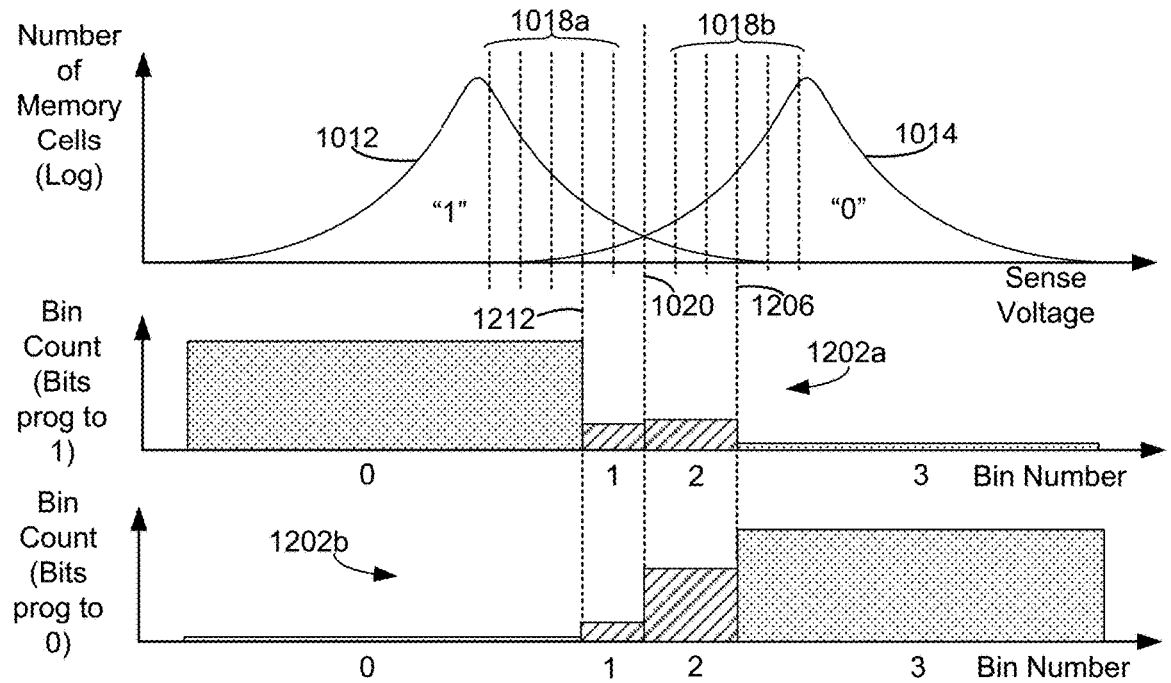
Figure 12E:
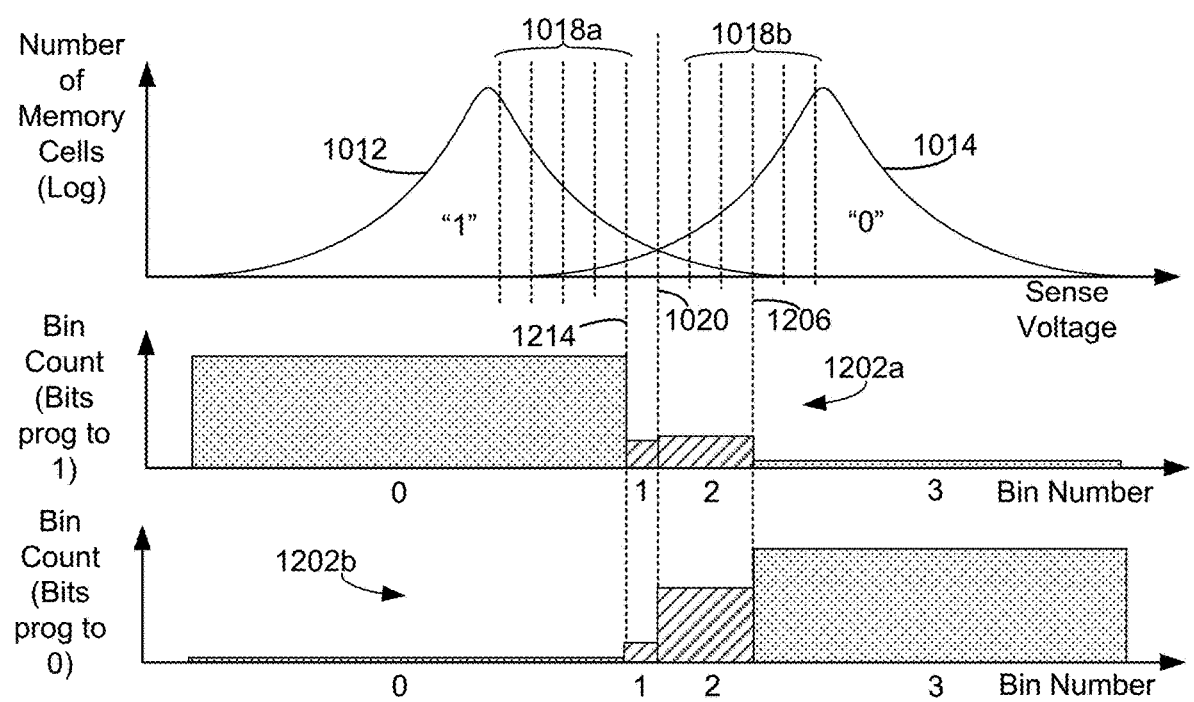

FIG. 12B shows bins 1202a, 1202b for when SB reference voltage 1208 is being analyzed. FIG. 12C shows bins 1202a, 1202b for when SB reference voltage 1210 is being analyzed. FIG. 12D shows bins 1202a, 1202b for when SB reference voltage 1212 is being analyzed. FIG. 12E shows bins 1202a, 1202b for when SB reference voltage 1214 is being analyzed. Note that in each case, SB reference voltage 1206 is used. Thus, when testing the lower candidate SB reference voltages 1018a, the upper SB reference voltage 1018b is fixed. Note that fixing this at SB reference voltage 1206 is one example. The upper SB reference voltage 1018b could be fixed at a different level.

Steps 1110 and 1112 may be implemented using the following Equations. In the below Equations, the summation is over all of the bits in the page (or codeword).

$$N[\text{bin} = i, prog \cdot \text{bit} = x]$$

$$\sum_{k=\text{all bits in page}} 1_{[bit_k \in bin\ i\ and\ progbit_k = x]}$$

where i=1:# of bins, and x=0,1

$$1_{[condition]} = \begin{cases} 0, & \text{condition not met} \\ 1, & \text{condition met} \end{cases}$$

In the above Equations, $1_{[condition]}$ refers to the indicator function. N[I,x] is the number of bits (e.g., memory cells) in a given SB bin that were programmed to a certain value (i.e., either 1 or 0). The bins 1202a, 1202b in FIGS. 12A-12E provide a visual representation of N[I,x].

Step 1114 include calculating the channel transition matrix. The channel transition matrix [P(y|x)] may be calculated using the following Equations.

$$P(y_i \mid x) = \frac{N[i, x]}{N_x}, i = 1, \ldots, \text{\# of bins}, x = 0, 1$$

where $N_0 = \sum_{i=1}^{\text{\# of bins}} N[i, 0], N_1 = \sum_{i=1}^{\text{\# of bins}} N[i, 1]$ Step 1116 includes calculating the MI. The MI may be calculated using the following Equation.

$$MI = H(\rho_{y|x} \cdot \rho_x) - H(\rho_{y|x})$$

In the above Equation, H is the Shannon entropy function, and $p_x$ is the is the probability of the programmed data being 0/1. The probability can be calculated according to the following Equations.

$$p_0 = \frac{N_0}{N_0 + N_1}, p_1 = \frac{N_1}{N_0 + N_1}$$

The probability can be simplified to $p_0 = p_1 = 0.5$ if the data is scrambled.

Step 1118 is a determination of whether there is another candidate SB reference voltage to be analyzed. If so, steps 1104-1116 are repeated for the next candidate SB reference voltage. For example, after calculating the MI for SB reference voltage 1204 (see FIG. 12A), the MI for SB reference voltage 1208 (see FIG. 12B) may be calculated. After the MI for all of the lower candidate SB reference voltages 1018a are analyzed, step 1120 is performed. Step 1120 includes selecting a SB reference voltage level that maximizes the MI. Hence, the SB reference voltage for which the MI in step 1116 was the highest may be selected. Thus, step 1120 may be used to, for example, select SB reference voltage 1026 from lower candidate SB reference voltages 1018a (see FIG. 10). In one embodiment, the new SB reference voltage is based on two candidate SB reference voltage levels that have the highest MI. For example, a weighted average of the two candidate SB reference voltage levels may be used, where the weight is based on the respective values for the MI.

Process 1100 may then be repeated for the upper SB reference voltages 1018b. The process will be similar as for the lower SB reference voltages 1018a. However, the bins 1202 will be different than those depicted in FIGS. 12A-12E. The lower SB reference voltage 1018a is fixed for all cases, with the upper SB reference voltage 1018b being different for each case. In this manner, MI is determined for each of the upper SB reference voltages 1018b. Referring again to FIG. 10, performing process 1100 is one technique for determining the MI 1016.

Figure 13:
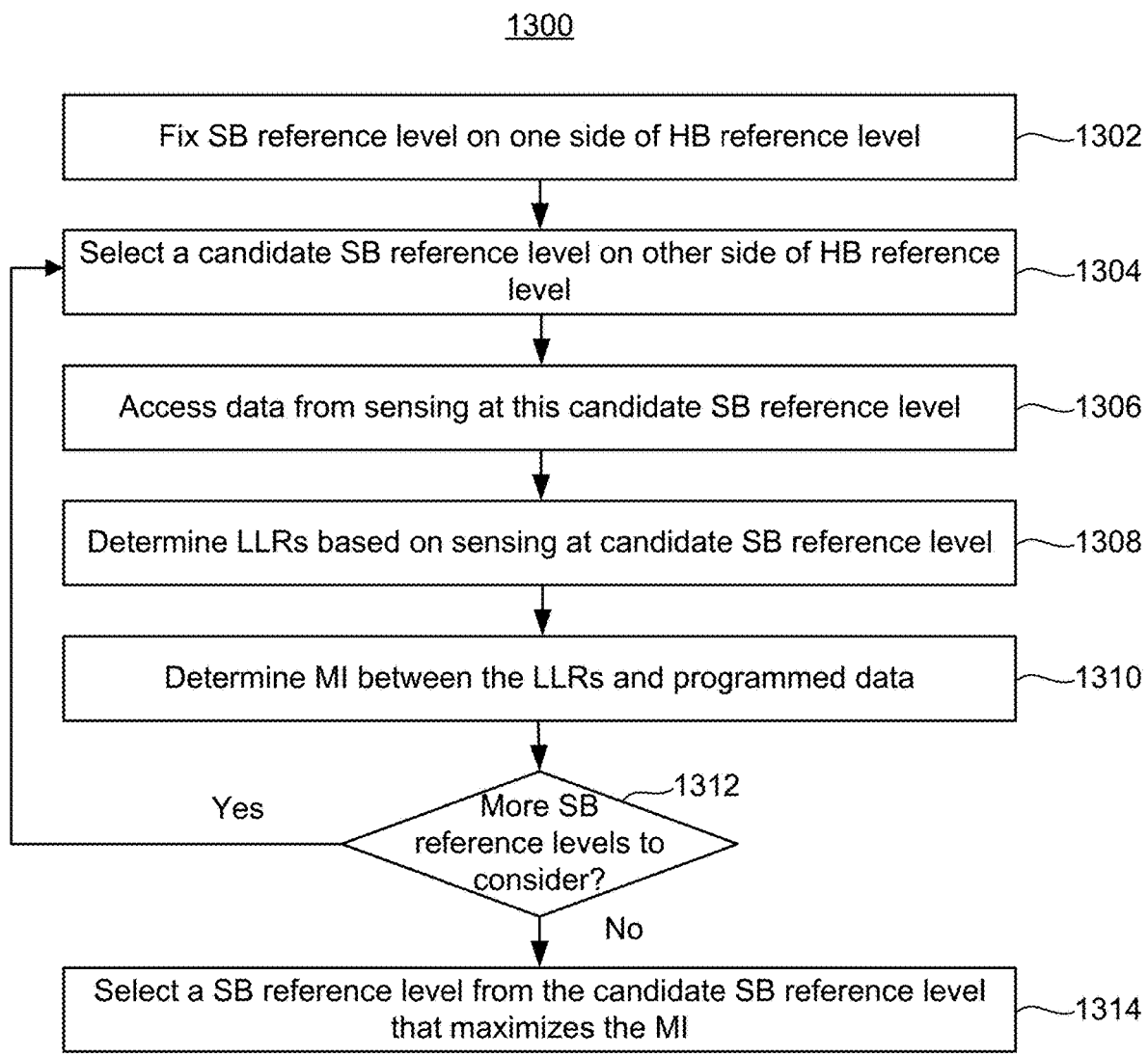
FIG. 13 is a flowchart of one embodiment of a process in which mutual information is calculated based on LLRs.

In some embodiments, the MI is calculated based on log-likelihood ratios (LLRs). FIG. 13 is a flowchart of one embodiment of a process 1300 in which MI is calculated based on LLRs. Process 1300 provides further details for one embodiment of step 908 of process 900. Step 1302 includes fixing the SB reference voltage on the side of the HB reference voltage that is not presently being calibrated. Fixing the SB reference voltage means that the SB reference voltage is not changed during process 1300. Step 1304 includes selecting a candidate SB reference voltage on the side of the HB reference voltage that is being calibrated.

Step 1306 includes accessing data based on sensing at the candidate SB reference voltage. The data may be based on sensing at more than just the candidate SB reference voltage. For example, the data may be also based on sensing at HB reference voltage, as well as one or more other SB reference voltages. This is analogous to the discussion in step 1106 in which the data for candidate lower candidate SB reference voltage 1204 may be also based on sensing at HB reference voltage 1020, and the fixed upper SB reference voltage 1206. The data could also be based on sensing at SB reference voltages associated with other HBs needed to read a page (or ECC codeword). In one embodiment, the data is sent to the memory controller 102 from either the memory die 300 or the control die 304.

Step 1308 includes determining LLRs for the data based on sensing at the candidate SB reference voltage. The LLR is a probability of a decoded bit having a given value. The sign of the LLR typically provides the bit estimation (i.e. a positive LLR corresponds to the bit being 0 and a negative LLR corresponds to the bit being 1). The magnitude of the LLR provides the reliability of the estimation (i.e. |LLR|=0 means that the estimation is completely unreliable and |LLR|=∞ means that the estimation is completely reliable and the bit value is known). The LLRs may be determined by an ECC decoder. In some embodiments, the LLRs are determined by a Low Density Parity Check (LDCP) decoder. In some embodiments, the LLRs are determined by the memory controller 102. However, the LLRs could be determined by, for example, ECC engine 330 on either the control die 304 or the memory die 300.

Step 1310 includes estimating the MI based on the LLRs and the programmed data. In one embodiment, the MI is calculated using the following Equation.

$$MI \approx E\left[1 - \log_2\left(1 + 2^{PB*LLR}\right)\right] \approx \frac{1}{N}\left[1 - \sum_{i=0,\ldots N-1} \log_2\left(1 + 2^{PB*LLR}\right)\right]$$

In the above Equation, E[] is the expectation function. PB is the programmed data translated from 0/1 to +/− 1. For example, PB=1-2x where x is the programmed bit. In other words, 0 may be represented as 1, and 1 may be represented as −1. In the above Equation, the summation is over all of the bits in the codeword. Hence, in this example, there are N bits in the codeword. In the above summation, if the LLR agrees with the programmed bit (PB), it will contribute highly to the MI.

Step 1312 is a determination of whether there are more candidate SB reference voltages to consider. If so, steps 1304-1310 are repeated to determine MI for the next candidate SB reference voltage. After MI has been determined for all candidate SB reference voltages, one of the candidate SB reference voltages is selected in step 1314. Step 1314 includes selecting a candidate SB reference voltage that maximizes the MI. Thus, step 1314 may be used to, for example, select SB reference voltage 1026 from lower candidate SB reference voltages 1018a (see FIG. 10). Similarly, step 1314 may be used to, for example, select SB reference voltage 1028 from upper candidate SB reference voltages 1018b (see FIG. 10). In one embodiment, the new SB reference voltage is based on two candidate SB reference voltages that have the highest MI. For example, a weighted average of the two candidate SB reference voltages may be used, where the weight is based on the respective values for the MI.

In some embodiments, sensing is performed at a predetermined set of candidate SB reference voltages. For example, with reference to FIG. 10, sensing may occur at each of the ten candidate SB reference voltages 1018 in order to calibrate both the lower and upper SB reference voltages. In another embodiment, time and/or power is saved by avoiding sensing at one of more of the candidate SB reference voltages. Sensing can be avoided by assuming that the MI for a set of candidate SB reference voltages is a unimodal function with a single peak. This approach may be referred to herein as a gradient approach.

Figure 14:
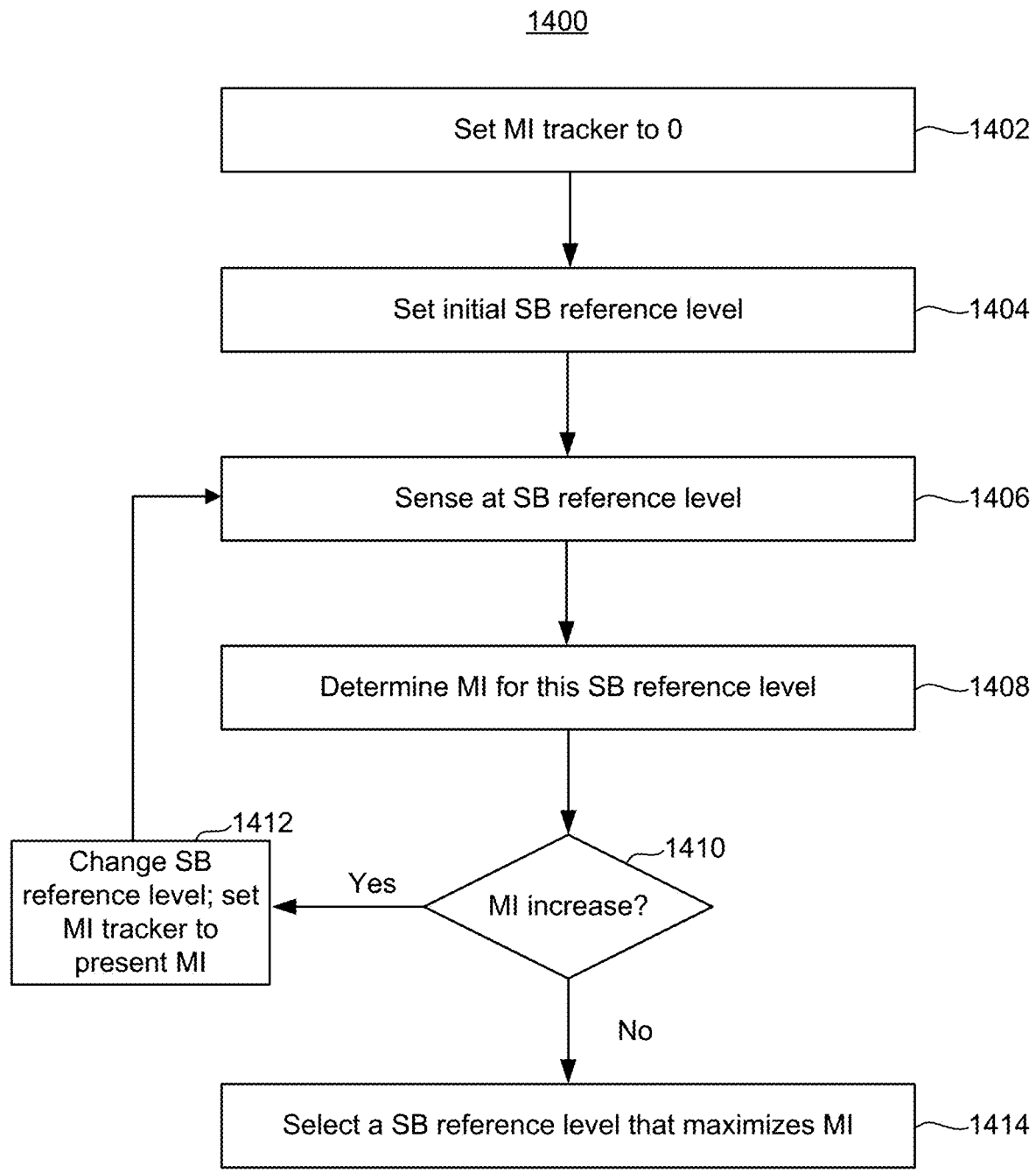
FIG. 14 is a flowchart of one embodiment of a process of sensing at a reduced set of candidate soft bit reference voltages, as well determining mutual information.

FIG. 14 is a flowchart of one embodiment of a process 1400 of a gradient approach at sensing and determining MI. The process 1400 is one embodiment of steps 906 and 908 of process 900. Step 1402 includes setting an MI tracker to 0. This is a variable that is used to track the MI. As will be seen, the process stops examining new candidate SB reference levels if the MI fails to increase from one candidate SB reference level to the next.

Step 1404 includes setting an initial SB reference level. Process 1400 will be discussed with reference to FIG. 15. An example will be discussed of calculating the MI for the lower candidate SB reference levels 1018a. The initial SB reference level may be candidate SB reference level 1502.

Step 1406 includes sensing at the initial candidate SB reference level. The first sensing may occur at candidate SB reference level 1502. Note that prior to process 1400, sensing may be performed at the HB reference level 1020. In some embodiments, sensing is also performed at one of the upper SB reference levels 1018b. This other sensing may be performed to generate the data that is based, in least in part on, sensing at the lower candidate reference level 1018a.

Step 1408 includes determining the MI for this candidate SB reference level. In one embodiment, the MI is determined based on a channel transition matrix, as described above in connection with process 1100. In one embodiment, the MI is determined as described in steps 1104-1116 of process 1100. In one embodiment, the MI is determined based on LLRs, as described above in connection with process 1300. In one embodiment, the MI is determined as described in steps 1304-1310 of process 1300.

Step 1410 is a determination of whether the MI has increased. In the first iteration of process 1400, the MI will increase. In step 1412 the candidate SB reference level is changed. In one embodiment, the voltage of the SB reference level is decreased. For example, the SB reference level is changed to SB reference level 1504. The MI tracker is updated to the present MI, which refers to the MI calculated in step 1408. Then, steps 1406 and 1408 are performed again. With reference to the example in FIG. 15, the MI 1216 increases for SB reference level 1504, so step 1412 is performed again. This time the SB reference level is set to SB reference level 1026. The MI tracker is updated to the present MI, which refers to the MI calculated in step 1408. Then, steps 1406 and 1408 are performed again. With reference to the example in FIG. 15, the MI increases for SB reference level 1026, so step 1412 is performed again. This time the SB reference level is set to SB reference level 1506. The MI tracker is updated to the present MI, which refers to the MI calculated in step 1408. Then, steps 1406 and 1408 are performed again. With reference to the example in FIG. 15, the MI does not increase for SB reference level 1506, relative to SB reference level 1026. Thus, no more sensing is performed for the lower candidate SB reference levels 1018a.

Figure 15:
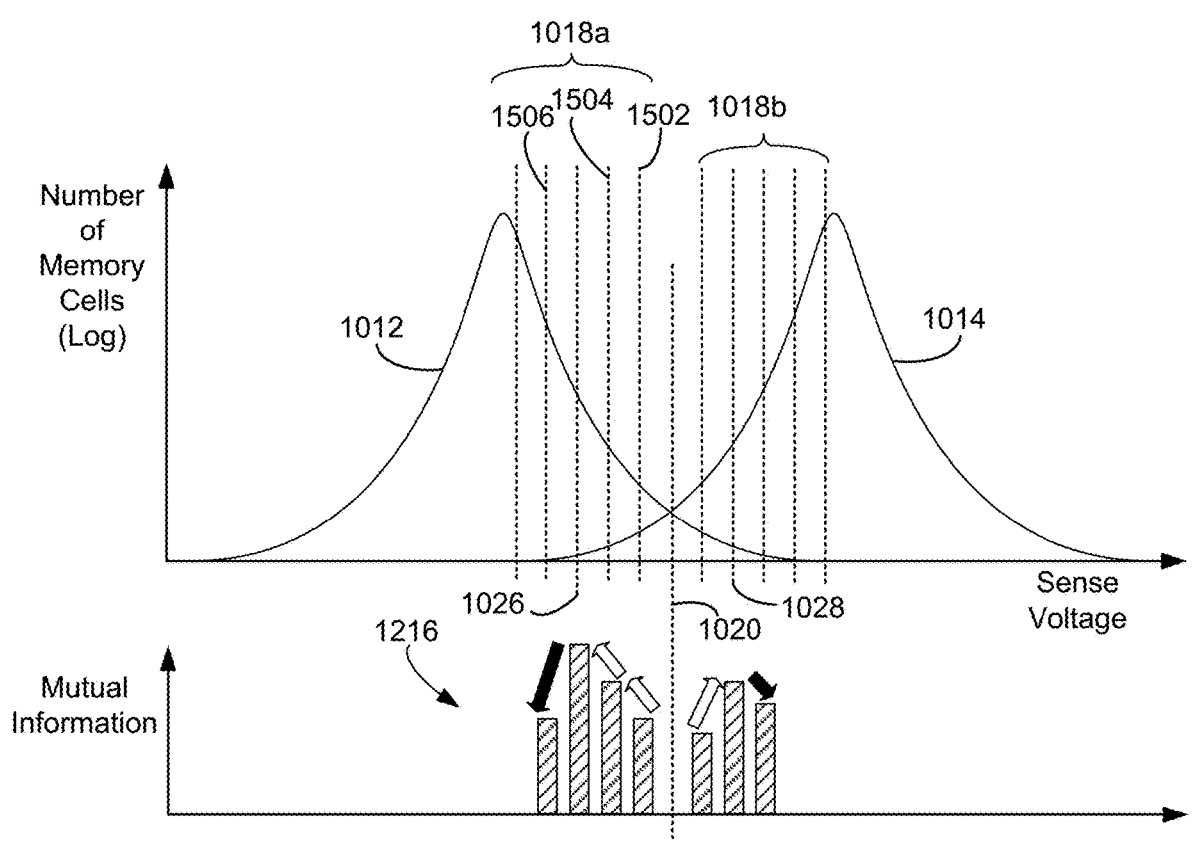
FIG. 15 depicts threshold distributions with mutual information for candidate soft bit reference levels associated with a hard bit reference level.

In step 1414 a SB reference level that maximizes the MI is selected. In the example of FIG. 15, SB reference level 1026 has the largest MI for the lower candidate SB reference levels 1018a, and is therefore selected. In one embodiment, the new SB reference level is based on two candidate SB reference levels that have the highest MI. For example, a weighted average of the two candidate SB reference levels may be used, where the weight is based on the respective values for the MI.

The process 1400 may be repeated for the upper candidate SB reference levels 1018b. Note that the white arrows by the MI 1216 in FIG. 15 represent increasing MI 1216, and the block arrows indicate decreasing MI 1216. For the upper candidate SB reference levels 1018b sensing may take place at just three candidate SB reference levels, with SB reference level 1028 selected based on having the largest MI.

Figure 16:
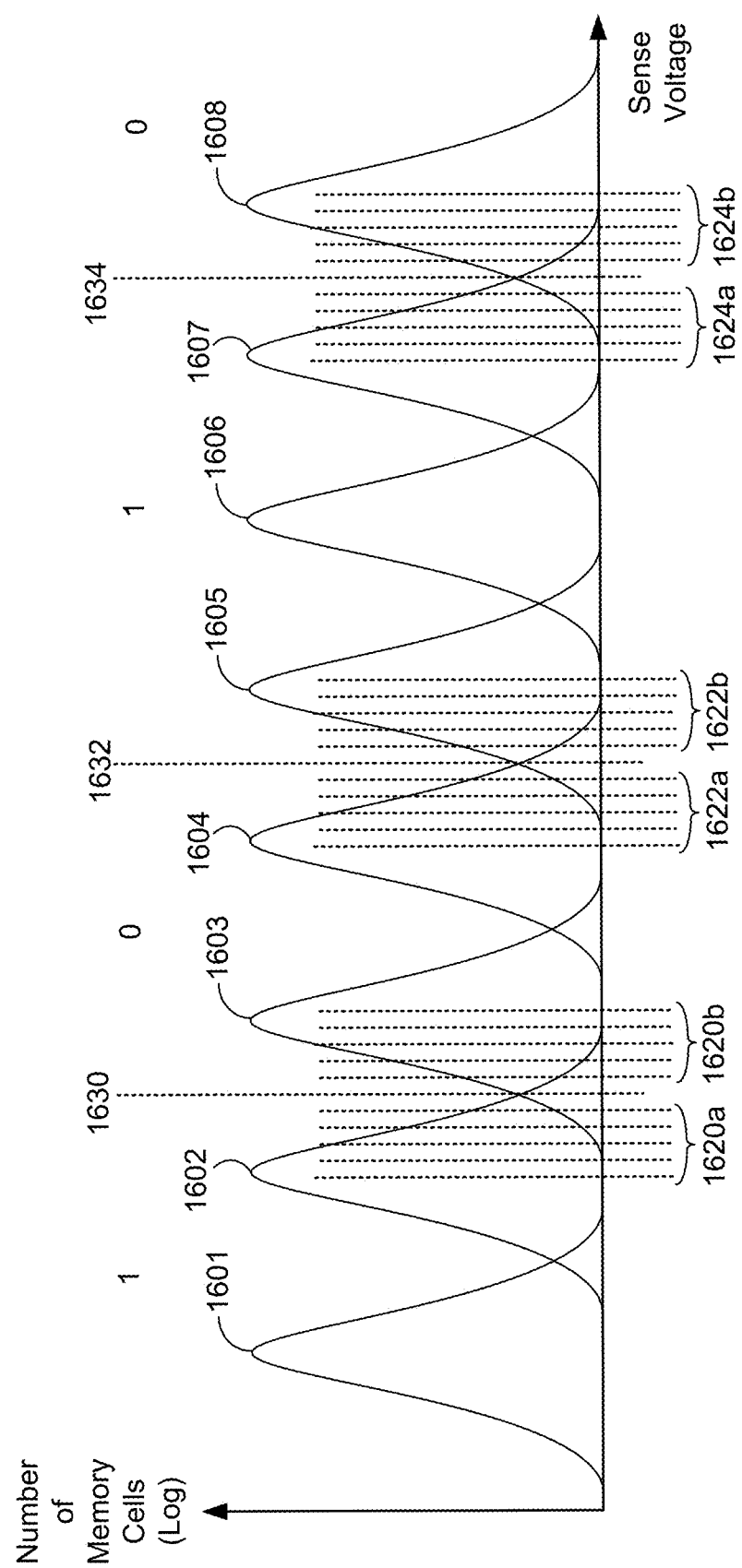
FIG. 16 depicts threshold distribution, with associated soft bit and hard bit reference voltage.

One embodiment includes emulating SB reads. Emulating SB reads can be used to generate additional SBs from a relatively few number of candidate SB reads. FIG. 16 depicts threshold distributions, with associated SB and HB reference voltages. FIG. 16 depicts eight memory cell distributions 1601-1608, which correspond to eight data states. Hence the memory cells store three bits each, or three pages for the group. In one embodiment, each page is stored as an ECC codeword. HB reference voltages 1630, 1632, and 1634 are used to read one of the pages of data. In an embodiment, if a memory cell is read as having a Vt below HB reference voltage 1630, the bit is reported as a 1. If the memory cell is read as having a Vt between HB reference voltage 1630 and HB reference voltage 1632, the bit is reported as a 0. If the memory cell is read as having a Vt between HB reference voltage 1632 and HB reference voltage 1634, the bit is reported as a 1. If the memory cell is read as having a Vt above HB reference voltage 1634, the bit is reported as a 0. The HB reference voltages used to read other pages are not shown in FIG. 16.

Consistent with other examples herein, ten candidate SB reference voltages are depicted for each HB reference voltage. Lower candidate SB voltages 1620a and upper candidate SB voltages 1620b are depicted by HB reference voltage 1630. Lower candidate SB voltages 1622a and upper candidate SB voltages 1622b are depicted by HB reference voltage 1632. Lower candidate SB voltages 1624a and upper candidate SB voltages 1624b are depicted by HB reference voltage 1634.

Figure 17:
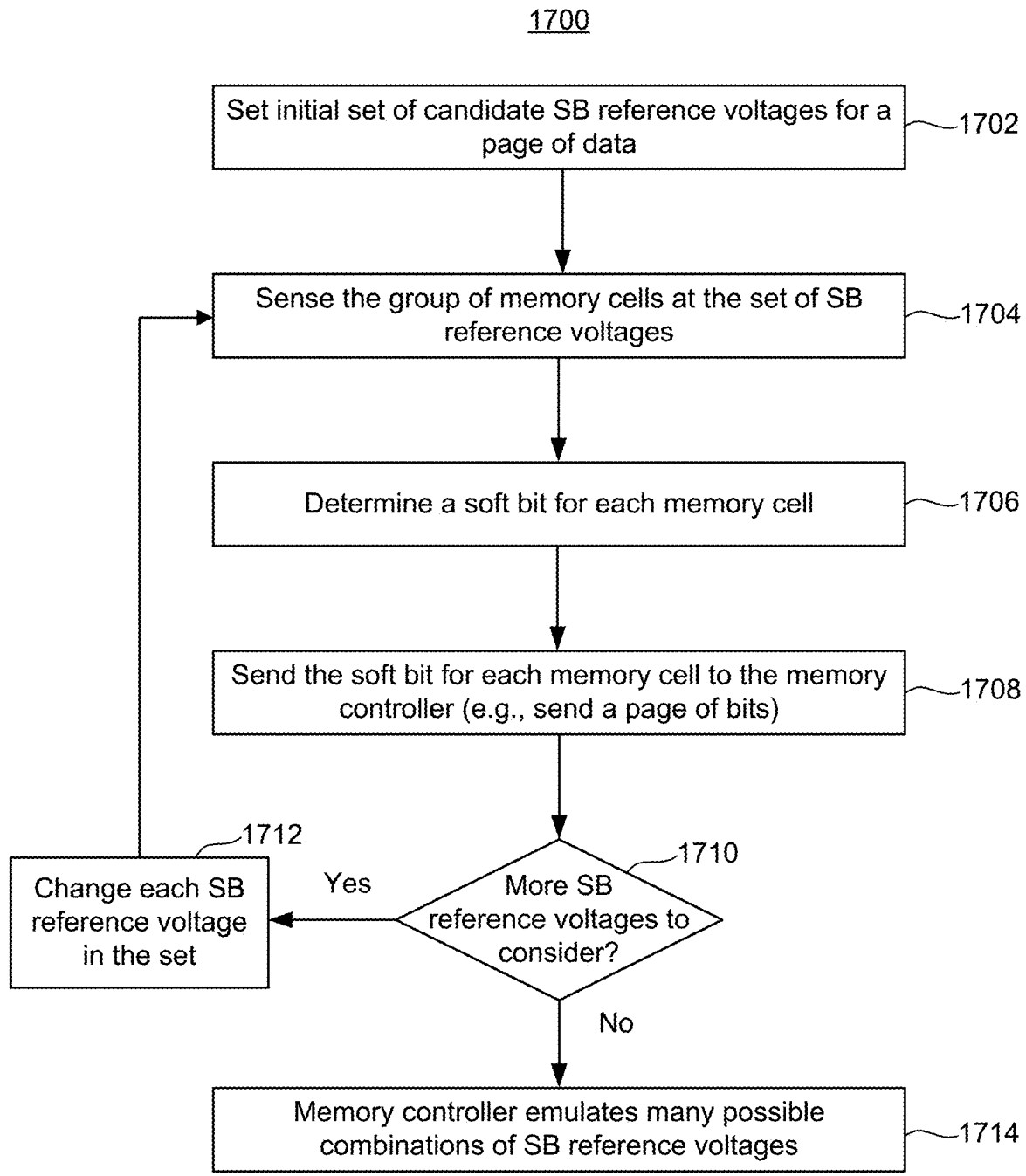
FIG. 17 is a flowchart of an embodiment of a process of emulating soft bit reads.

FIG. 17 is a flowchart of an embodiment of a process 1700 of digitally emulating SB reads. Step 1702 includes setting an initial set of candidate SB reference voltages for a page of data. With reference to FIG. 16, the initial set may include the leftmost candidate SB reference voltage associated with each HB reference voltage. Hence, a total of three candidate SB reference voltages are selected in an embodiment of step 1702.

Step 1704 includes sensing the group of memory cells are the set of candidate SB reference voltages.

Step 1706 includes determining a SB for each memory cell. In an embodiment, step 1706 determines the SB in similar manner as a HB would be determined. However, instead of using the HB reference levels 1630, 1632, and 1634, the three candidate SB reference levels are used.

Step 1708 includes sending the SB for each memory cell to the memory controller 102. Thus, one page of bits may be sent to the memory controller 102.

Step 1710 is a determination of whether more candidate SB reference voltages are to be sensed. In the example of FIG. 16, a total of 10 sets of candidate SB reference voltages will be sensed. Each set will have one candidate SB reference voltage for each HB reference voltage. Step 1712 includes changing each candidate SB reference voltage. For example, the next candidate SB reference voltage to the right (i.e., higher voltage) of each previous one may be selected. In the example of FIG. 16, the process 1700 will loop ten times, such that ten SBs for each memory cell are sent to the memory controller 102. In other words, ten pages of SBs are sent to the memory controller 102.

Step 1714 includes the memory controller 102 emulating many possible combinations of SB reference voltages. With reference to FIG. 16, note that there are many possible combinations of SB reference voltages, assuming one SB reference voltage is used for each HB reference voltage. In an embodiment, all of the possible combinations having one SB reference voltage per HB reference voltage are digitally emulated. The digital emulation is based on the information contained in the ten pages that were sent to the memory controller 102.

Figure 18:
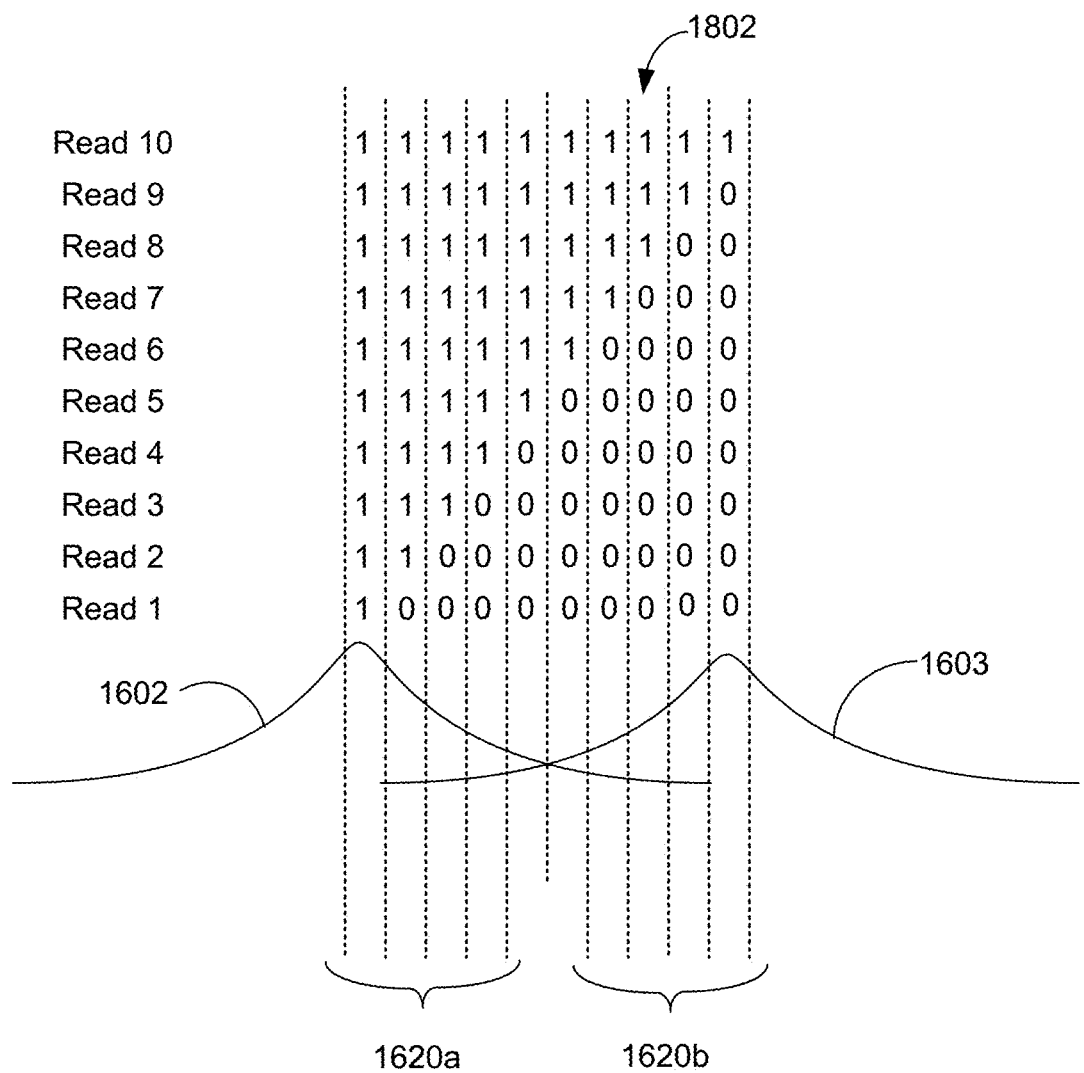
FIG. 18 shows two threshold distributions and information from the pages sent to the memory controller in order to illustrate an embodiment of digital emulation of soft bit reads.

FIG. 18 shows two threshold distributions and information from the pages sent to the memory controller 102, in order to illustrate an embodiment of digital emulation of SB reads. Distributions 1602 and 1603 from FIG. 16 are depicted, as well as the lower candidate SB reference voltages 1620a and the upper candidate SB reference voltages 1620b. The ten reads refer to the reading of the ten pages of SBs in process 1700. The numbers 1 and 0 indicate whether a memory cell should have been read as a 0 or 1 if it is in the "bin" between two SB reference voltages. For example, if a memory cell is in bin 1802, then it will be read as a 0 for read 1 through read 7, and will be read as a 1 for reads 8 through 10. Similar reasoning applies to other bins in FIG. 18.

This technique may also be used for the SB bins associated with the other HB reference voltages in FIG. 16. However, a memory cell that is read as a 0 for read 1 through read 7, and read as a 1 for reads 8 through 10 may also be in a SB bin associated with HB reference voltage 1634. Reading at, for example, HB reference voltage 1632 can resolve any ambiguity between these two cases.

The digital emulation may thus determine which SB bin each memory cell is in. From this SB bin information, the memory controller 102 can "emulate" a SB read at any combination of SB reference voltages (with one SB reference voltage per HB reference voltage). Therefore, it is not necessary to physically read the memory cells at all these combinations of SB reference voltages. Moreover, it is not necessary to transfer a page of SBs to the memory controller 102 for each combination of SB reference voltages.

Figure 19:
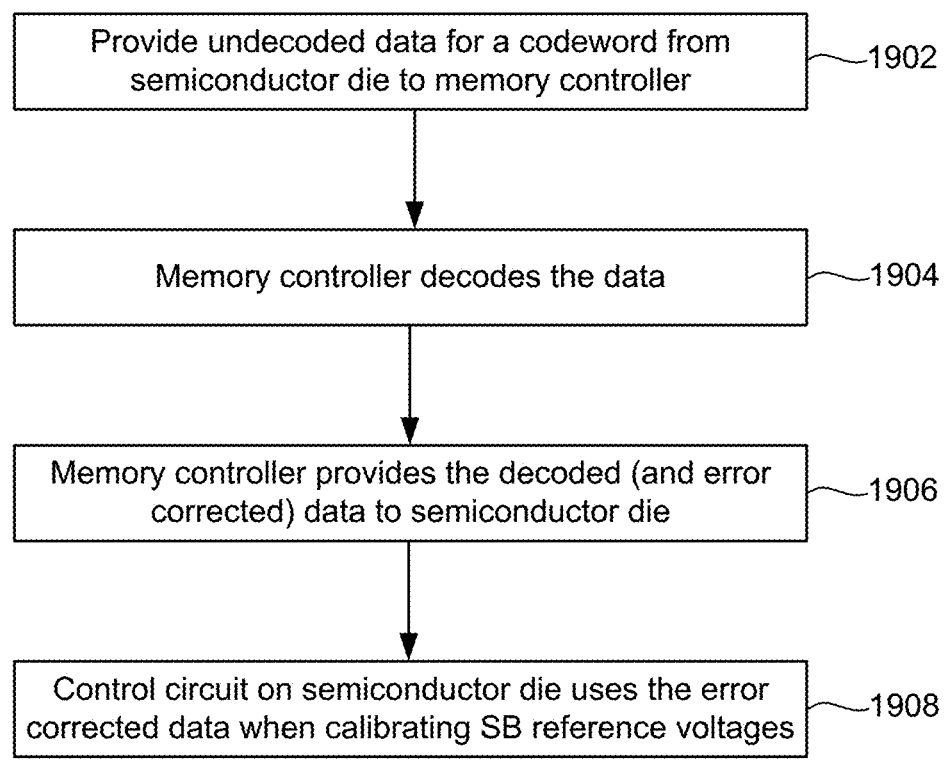
FIG. 19 is a flowchart depicting one embodiment of a process of transferring data during calibration of soft bit reference levels.

FIG. 19 is a flowchart depicting one embodiment of a process 1900 of transferring data during calibration of soft bit reference levels. Step 1902 includes providing undecoded (or raw) data for a codeword from a semiconductor die to the memory controller 102. In one embodiment, the undecoded data is provided from the control die 304 to the memory controller 102. In one embodiment, the undecoded data is provided from the memory die 300 to the memory controller 102. This is data that may be read in step 902 of FIG. 9.

Step 1904 includes the memory controller 102 decoding the data. The memory controller 102 thus corrects any errors in the data to recover the original data. Step 1904 is one embodiment of step 904 of FIG. 9.

Step 1906 includes the memory controller 102 transferring the decoded (and error corrected) data to the semiconductor die. In one embodiment, the decoded data is provided to the control die 304. In one embodiment, the decoded data is provided to the memory die 300.

Step 1908 includes a control circuit on the semiconductor die using the error corrected data when calibrating SB reference voltages. The control circuit may perform steps 906-910 of FIG. 9, process 1100, process 1300, and/or process 1400, but is not limited thereto. The control circuit may include, for example, soft bit reference voltage calibration 334. The control circuit may include other elements such as one or more of state machine 312, decoders 314, power control 316, and/or read/write circuits 328.

In view of the above, it can be seen that a first aspect includes an apparatus, comprising a memory controller interface; and one or more control circuits configured to connect to a memory structure comprising non-volatile memory cells. The one or more control circuits are configured to read encoded data from a group of the non-volatile memory cells. Reading the codeword may include sensing the group at one or more hard bit reference levels. The one or more control circuits are configured to provide the encoded data to a data decoder. The one or more control circuits are configured to receive error corrected data from the data decoder to recover original data that was programmed into the group. The one or more control circuits are configured to sense the group at candidate soft bit reference levels associated with the one or more hard bit reference levels, thereby generating data for each respective candidate soft bit reference level. The one or more control circuits are configured to calculate, for each candidate soft bit reference level, mutual information between the error corrected data and the data for the respective candidate soft bit reference level. The one or more control circuits are configured to establish, based on the mutual information, a soft bit reference level for sensing non-volatile memory cells in the memory structure.

In a second aspect, and in furtherance of the first aspect, establishing the soft bit reference levels for sensing non-volatile memory cells in the memory structure comprises the one or more control circuits selecting a candidate soft bit reference level that has the greatest mutual information between the error corrected data and the data for the respective candidate soft bit reference levels.

In a third aspect, and in furtherance of the first or second aspect, the calculating, for each candidate soft bit reference level, mutual information between the error corrected data and the data for the respective candidate soft bit reference level comprises the one or more control circuits: calculating a channel transition matrix for each respective candidate soft bit reference level based on data sensed at the respective candidate soft bit reference level; and calculating mutual information between each channel transition matrix and the error corrected data.

In a fourth aspect, and in furtherance of the first or second aspect, the calculating, for each candidate soft bit reference level, mutual information between the error corrected data and the data for the respective candidate soft bit reference level comprises the one or more control circuits: determining log-likelihood ratios for each respective candidate soft bit reference level based on data sensed at the respective candidate soft bit reference level; and calculating mutual information between the error corrected data and the log-likelihood ratios for each respective candidate soft bit reference level.

In a fifth aspect, and in furtherance of any of the first to fourth aspects, the control sensing the group at the candidate soft bit reference levels comprises the one or more control circuits sensing the group of the non-volatile memory cells at each of a pre-determined set of candidate soft bit reference levels.

In a sixth aspect, and in furtherance of any of the first to fifth aspects, sensing the group at the candidate soft bit reference levels and calculating the mutual information comprises the one or more control circuits: a) sensing the group of the non-volatile memory cells at a candidate soft bit reference level; b) calculating mutual information between the error corrected data and the data sensed at the candidate soft bit reference level; and c) repeating said a) and said b) for different candidate soft bit reference levels until the mutual information no longer increases.

In a seventh aspect, and in furtherance of any of the first to sixth aspects, sensing the group at the candidate soft bit reference levels comprises the one or more control circuits: sensing data for a plurality of sets of candidate soft bit reference levels, wherein each set includes one candidate soft bit level for each hard bit associated with page of data; instructing the memory controller interface to send a soft bit for each memory cell in the group for each set of candidate soft bit reference levels over a communication channel to a memory controller; and emulating, by the memory controller, combinations of candidate soft bit reference levels for the page based on the soft bit for each memory cell in the group for each set of candidate soft bit reference levels.

In an eighth aspect, and in furtherance of any of the first to seventh aspects, the apparatus comprises: a semiconductor die that contains the data decoder, the semiconductor die comprises one or more control circuits configured to: calculate the mutual information between the error corrected data and the data for each candidate soft bit reference level; and establish the soft bit reference level for sensing non-volatile memory cells in the memory structure based on the mutual information.

In a ninth aspect, and in furtherance of any of the first to eighth aspects, the apparatus comprises: a semiconductor die comprising the memory controller interface and the one or more control circuits configured to connect to the memory structure; and a memory controller in communication with the semiconductor die over a communication channel, wherein the memory controller comprises the data decoder; wherein the memory controller interface is configured to provide the encoded data over the communication channel to the data decoder.

In a tenth aspect, and in furtherance of the ninth aspect one or more control circuits of the semiconductor die are configured to: receive the error corrected data from the memory controller to recover the original data that was programmed into the group; calculate the mutual information between the error corrected data and the data for the respective the candidate soft bit reference levels; and establish the soft bit reference level for sensing non-volatile memory cells in the memory structure based on the mutual information.

In an eleventh aspect, and in furtherance of the ninth aspect, the memory controller: receives the error corrected data from the data decoder to recover the original data that was programmed into the group; calculates the mutual information between the error corrected data and the data for the respective the candidate soft bit reference levels; and establishes the soft bit reference level for sensing non-volatile memory cells in the memory structure based on the mutual information.

In a twelfth aspect, and in furtherance of any of the first to elevenths aspects, the one or more hard bit reference levels are one or more hard bit reference voltages; sensing the group at the candidate soft bit reference levels comprises the one or more control circuits sensing the group at lower candidate soft bit reference voltages and upper candidate soft bit reference voltages for each of the one or more hard bit reference voltages; calculating the mutual information comprises the one or more control circuits calculating, for each lower candidate soft bit reference voltage and for each upper candidate soft bit reference voltage, mutual information between the error corrected data and the data sensed based on the candidate soft bit reference voltage; establishing a soft bit reference level comprises the one or more control circuits: i) selecting, for each hard bit reference voltage, a lower candidate soft bit reference voltage that has the highest mutual information as a calibrated lower soft bit reference voltage; and ii) selecting, for each hard bit reference voltage, an upper candidate soft bit reference voltage that has the highest mutual information as a calibrated upper soft bit reference voltage.

One embodiment includes a method of operating non-volatile storage. The method comprises sensing a group of the non-volatile memory cells at one or more HB reference voltages to generate encoded data. The method comprises decoding and error correcting the encoded data to recover data that was programmed into the group. The method comprises sensing the group at lower candidate soft bit reference voltages and upper candidate soft bit reference voltages for each of the one or more hard bit reference voltages. The method comprises calculating, for each lower candidate soft bit reference voltage and for each upper candidate soft bit reference voltage, mutual information between the error corrected data and the data sensed based on the candidate soft bit reference voltage. The method comprises selecting, for each hard bit reference voltage, a lower candidate soft bit reference voltage that has the highest mutual information as a calibrated lower soft bit reference voltage. The method comprises selecting, for each hard bit reference voltage, an upper candidate soft bit reference voltage that has the highest mutual information as a calibrated upper soft bit reference voltage.

One embodiment includes a non-volatile memory system comprising a memory structure comprising non-volatile memory cells. The memory system comprises sensing means for reading a codeword from a group of the non-volatile memory cells based on one or more hard bit reference levels. The sensing means is further for sensing the group at candidate soft bit reference voltages, thereby generating data for each respective candidate soft bit reference voltage based on sensing at the respective candidate soft bit reference voltage and a hard bit reference voltage associated with the respective candidate soft bit reference voltage. The memory system comprises decoding means for decoding and error correcting the codeword to recover original data that was programmed into the group. The memory system comprises soft bit calibration means for selecting calibrated soft bit reference voltages based on highest mutual information between the original data and the data for each candidate soft bit reference voltage.

In one embodiment, the sensing means comprises one or more of state machine 312, address decoders 314, power control 316, read/write circuits 328, and/or sense block 350. In one embodiment, the sensing means performs steps 1102-1106 of process 1100. In one embodiment, the sensing means performs steps 1302-1306 of process 1300. In one embodiment, the sensing means performs steps 1702-1708 of process 1700.

In one embodiment, the decoding means comprises one or more of ECC 226/256, ECC engine 330, and/or decoder 390.

In one embodiment, the soft bit calibration means comprises one or more of read reference voltage calibration engine (225/255), soft bit reference voltage calibration 334. In one embodiment, the soft bit calibration means performs steps 1110-1120 of process 1100. In one embodiment, the soft bit calibration means performs steps 1308-1314 of process 1300. In one embodiment, the soft bit calibration means performs steps 1406-1414 of process 1400.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus comprising:
   a memory controller interface; and
   one or more control circuits configured to connect to a memory structure comprising non-volatile memory cells, wherein the one or more control circuits are configured to:
      read encoded data from a group of the non-volatile memory cells, including sense the group at one or more hard bit reference levels;
      provide the encoded data to a data decoder;
      receive error corrected data from the data decoder to recover original data that was programmed into the group;
      sense the group at candidate soft bit reference levels associated with the one or more hard bit reference levels, thereby generating data for each respective candidate soft bit reference level;
      calculate, for each candidate soft bit reference level, mutual information between the error corrected data and the data for the respective candidate soft bit reference level; and
      establish, based on the mutual information, a soft bit reference level for sensing non-volatile memory cells in the memory structure.

2. The apparatus of claim 1, wherein establishing the soft bit reference levels for sensing non-volatile memory cells in the memory structure comprises the one or more control circuits:
   selecting a candidate soft bit reference level that has the greatest mutual information between the error corrected data and the data for the respective candidate soft bit reference levels.

3. The apparatus of claim 1, wherein calculating, for each candidate soft bit reference level, mutual information between the error corrected data and the data for the respective candidate soft bit reference level comprises the one or more control circuits:
   calculating a channel transition matrix for each respective candidate soft bit reference level based on data sensed at the respective candidate soft bit reference level; and
   calculating mutual information between each channel transition matrix and the error corrected data.

4. The apparatus of claim 1, wherein calculating, for each candidate soft bit reference level, mutual information between the error corrected data and the data for the respective candidate soft bit reference level comprises the one or more control circuits:
   determining log-likelihood ratios for each respective candidate soft bit reference level based on data sensed at the respective candidate soft bit reference level; and
   calculating mutual information between the error corrected data and the log-likelihood ratios for each respective candidate soft bit reference level.

5. The apparatus of claim 1, wherein sensing the group at the candidate soft bit reference levels comprises the one or more control circuits:
   sensing the group of the non-volatile memory cells at each of a pre-determined set of candidate soft bit reference levels.

6. The apparatus of claim 1, wherein sensing the group at the candidate soft bit reference levels and calculating the mutual information comprises the one or more control circuits:

a) sensing the group of the non-volatile memory cells at a candidate soft bit reference level;
b) calculating mutual information between the error corrected data and the data sensed at the candidate soft bit reference level; and
c) repeating said a) and said b) for different candidate soft bit reference levels until the mutual information no longer increases.

7. The apparatus of claim 1, wherein sensing the group at the candidate soft bit reference levels thereby generating data for each candidate soft bit reference level comprises the one or more control circuits:
sensing data for a plurality of sets of candidate soft bit reference levels, wherein each set includes one candidate soft bit level for each hard bit associated with page of data;
instructing the memory controller interface to send a soft bit for each memory cell in the group for each set of candidate soft bit reference levels over a communication channel to a memory controller; and
emulating, by the memory controller, combinations of candidate soft bit reference levels for the page based on the soft bit for each memory cell in the group for each set of candidate soft bit reference levels.

8. The apparatus of claim 1, wherein the apparatus comprises:
a semiconductor die that contains the data decoder, the semiconductor die comprises one or more control circuits configured to:
calculate the mutual information between the error corrected data and the data for each candidate soft bit reference level; and
establish the soft bit reference level for sensing non-volatile memory cells in the memory structure based on the mutual information.

9. The apparatus of claim 1, wherein the apparatus comprises:
a semiconductor die comprising the memory controller interface and the one or more control circuits configured to connect to the memory structure; and
a memory controller in communication with the semiconductor die over a communication channel, wherein the memory controller comprises the data decoder;
wherein the memory controller interface is configured to provide the encoded data over the communication channel to the data decoder.

10. The apparatus of claim 9, wherein one or more control circuits of the semiconductor die are configured to: receive the error corrected data from the memory controller to recover the original data that was programmed into the group;
calculate the mutual information between the error corrected data and the data for the respective candidate soft bit reference levels; and establish the soft bit reference level for sensing non-volatile memory cells in the memory structure based on the mutual information.

11. The apparatus of claim 9, wherein the memory controller:
receives the error corrected data from the data decoder to recover the original data that was programmed into the group;
calculates the mutual information between the error corrected data and the data for the respective candidate soft bit reference levels; and
establishes the soft bit reference level for sensing non-volatile memory cells in the memory structure based on the mutual information.

12. The apparatus of claim 1, wherein:
the one or more hard bit reference levels are one or more hard bit reference voltages;
sensing the group at the candidate soft bit reference levels comprises the one or more control circuits sensing the group at lower candidate soft bit reference voltages and upper candidate soft bit reference voltages for each of the one or more hard bit reference voltages;
calculating the mutual information comprises the one or more control circuits calculating, for each lower candidate soft bit reference voltage and for each upper candidate soft bit reference voltage, mutual information between the error corrected data and the data sensed based on the candidate soft bit reference voltage;
establishing a soft bit reference level comprises the one or more control circuits:
i) selecting, for each hard bit reference voltage, a lower candidate soft bit reference voltage that has the highest mutual information as a calibrated lower soft bit reference voltage; and
ii) selecting, for each hard bit reference voltage, an upper candidate soft bit reference voltage that has the highest mutual information as a calibrated upper soft bit reference voltage.

13. A method of operating non-volatile storage, the method comprising:
sensing a group of non-volatile memory cells at one or more hard bit reference voltages to generate encoded data;
decoding and error correcting the encoded data to recover data that was programmed into the group;
sensing the group at lower candidate soft bit reference voltages and upper candidate soft bit reference voltages for each of the one or more hard bit reference voltages;
calculating, for each lower candidate soft bit reference voltage and for each upper candidate soft bit reference voltage, mutual information between the error corrected data and the data sensed based on the candidate soft bit reference voltage;
selecting, for each hard bit reference voltage, a lower candidate soft bit reference voltage that has the highest mutual information as a calibrated lower soft bit reference voltage; and
selecting, for each hard bit reference voltage, an upper candidate soft bit reference voltage that has the highest mutual information as a calibrated upper soft bit reference voltage.

14. The method of claim 13, wherein calculating the mutual information between the error corrected data and the data sensed based on the candidate soft bit reference voltages comprises:
calculating a channel transition matrix for each lower candidate soft bit reference voltage and for each upper candidate soft bit reference voltage based on data sensed at the respective candidate soft bit reference level; and
calculating mutual information between each channel transition matrix and the recovered data that was programmed into the group.

15. The method of claim 13, wherein calculating the mutual information between the error corrected data and the data sensed based on the candidate soft bit reference voltages comprises:
determining log-likelihood ratios for each lower candidate soft bit reference voltage and for each upper candidate soft bit reference voltage based on data sensed at the respective candidate soft bit reference level; and calculating mutual information between the recovered data that was programmed into the group and the log-likelihood ratios for each respective candidate soft bit reference level.

16. A non-volatile memory system, comprising:

a memory structure comprising non-volatile memory cells;

sensing means for reading a codeword from a group of the non-volatile memory cells based on one or more hard bit reference levels, the sensing means further for sensing the group at candidate soft bit reference voltages, thereby generating data for each respective candidate soft bit reference voltage based on sensing at the respective candidate soft bit reference voltage and a hard bit reference voltage associated with the respective candidate soft bit reference voltage;

decoding means for decoding and error correcting the codeword to recover original data that was programmed into the group; and soft bit calibration means for selecting calibrated soft bit reference voltages based on highest mutual information between the original data and the data for each candidate soft bit reference voltage.

17. The non-volatile memory system of claim 16, wherein the soft bit calibration means is further for:

calculating a channel transition matrix for each candidate soft bit reference voltage based on information sensed at the respective candidate soft bit reference voltage; and calculating mutual information between each channel transition matrix and the error corrected codeword.

18. The non-volatile memory system of claim 16, wherein the soft bit calibration means is further for:

determining log-likelihood ratios for each candidate soft bit reference voltage based on information sensed at the respective candidate soft bit reference voltage; and calculating mutual information between the error corrected codeword and the log-likelihood ratios for each candidate soft bit reference voltage.

19. The non-volatile memory system of claim 16, wherein the soft bit calibration means is further for:

a) instructing the sensing means to sense the group of the non-volatile memory cells at a candidate soft bit reference voltage;

b) determining mutual information between the error corrected codeword and the data sensed for the candidate soft bit reference voltage; and c) repeating said a) and said b) for different candidate soft bit reference voltages until the mutual information no longer increases.

20. The non-volatile memory system of claim 16, wherein the soft bit calibration means is further for:

instructing the sensing means to sense at a plurality of sets of candidate soft bit reference levels, wherein each set includes one candidate soft bit level for each hard bit associated with the codeword; and emulating combinations of candidate soft bit reference voltages for the codeword based on the soft bit for each memory cell in the group for each set of candidate soft bit reference voltages.

\* \* \* \* \*